(12) United States Patent
Wang et al.

(10) Patent No.: US 7,407,821 B2
(45) Date of Patent: Aug. 5, 2008

(54) SUBSTRATE PROCESSING METHOD

(75) Inventors: Xinming Wang, Tokyo (JP); Daisuke Takagi, Tokyo (JP); Akihiko Tashiro, Tokyo (JP); Akira Fukunaga, Tokyo (JP)

(73) Assignee: Ebara Corporation, Tokyo (JP)

( * ) Notice: Subject to any disclaimer, the term of this patent is extended or adjusted under 35 U.S.C. 154(b) by 283 days.

(21) Appl. No.: 10/874,245

(22) Filed: Jun. 24, 2004

(65) Prior Publication Data

US 2005/0009213 A1    Jan. 13, 2005

(30) Foreign Application Priority Data

Jun. 27, 2003    (JP) .............................. 2003-185061

(51) Int. Cl.
    *H01L 21/66* (2006.01)
(52) U.S. Cl. ........................ 438/16; 438/7; 257/E21.53; 356/630
(58) Field of Classification Search .................. 438/16, 438/7; 257/E21.53; 356/630
    See application file for complete search history.

(56) References Cited

U.S. PATENT DOCUMENTS

| | | | | |
|---|---|---|---|---|
| 4,141,780 A | * | 2/1979 | Kleinknecht et al. | 117/85 |
| 4,618,262 A | * | 10/1986 | Maydan et al. | 356/504 |
| 5,399,229 A | * | 3/1995 | Stefani et al. | 438/7 |
| 5,494,697 A | * | 2/1996 | Blayo et al. | 427/10 |
| 5,559,428 A | | 9/1996 | Li et al. | |
| 5,644,221 A | | 7/1997 | Li et al. | |
| 5,659,492 A | | 8/1997 | Li et al. | |
| 5,660,672 A | | 8/1997 | Li et al. | |
| 5,663,637 A | | 9/1997 | Li et al. | |
| 5,674,787 A | | 10/1997 | Zhao et al. | |
| 5,695,810 A | * | 12/1997 | Dubin et al. | 438/643 |
| 5,770,948 A | | 6/1998 | Li et al. | |
| 6,052,191 A | * | 4/2000 | Brayden et al. | 356/630 |
| 6,225,223 B1 | * | 5/2001 | Liu et al. | 438/687 |
| 6,233,046 B1 | * | 5/2001 | Alba et al. | 356/38 |
| 6,376,267 B1 | * | 4/2002 | Noack et al. | 438/16 |
| 6,429,943 B1 | * | 8/2002 | Opsal et al. | 356/625 |
| 6,479,384 B2 | * | 11/2002 | Komai et al. | 438/687 |
| 6,503,834 B1 | * | 1/2003 | Chen et al. | 438/687 |
| 6,568,290 B1 | * | 5/2003 | Poris | 73/866 |
| 6,573,606 B2 | * | 6/2003 | Sambucetti et al. | 257/762 |
| 6,723,626 B2 | * | 4/2004 | Tsuchiya et al. | 438/597 |
| 2001/0016363 A1 | * | 8/2001 | Yano et al. | 438/9 |
| 2001/0036676 A1 | * | 11/2001 | Mitsuhashi et al. | 438/8 |
| 2002/0102749 A1 | * | 8/2002 | Fielden et al. | 438/14 |
| 2002/0107660 A1 | * | 8/2002 | Nikoonahad et al. | 702/155 |

(Continued)

*Primary Examiner*—Bradley W. Baumeister
*Assistant Examiner*—Steven J Fulk
(74) *Attorney, Agent, or Firm*—Wenderoth, Lind & Ponack, L.L.P.

(57) ABSTRACT

There is provided a substrate processing method and apparatus which can measure and monitor thickness and/or properties of a film formed on a substrate as needed, and quickly correct a deviation in process conditions, and which can therefore stably provide a product of constant quality. A substrate processing method for processing a substrate having a metal and an insulating material exposed on its surface in such a manner that a film thickness of the metal, with an exposed surface of the metal as a reference plane, is selectively or preferentially changed, including measuring a change in the film thickness and/or a film property of the metal during and/or immediately after processing, and monitoring processing and adjusting processing conditions based on results of this measurement.

13 Claims, 20 Drawing Sheets

U.S. PATENT DOCUMENTS

2003/0113996 A1* 6/2003 Nogami et al. .............. 438/638
2003/0116439 A1* 6/2003 Seo et al. .................... 205/125
2003/0124263 A1* 7/2003 Ueno et al. ................. 427/404
2003/0129774 A1* 7/2003 Christian et al. ............. 438/10

* cited by examiner

F I G. 1
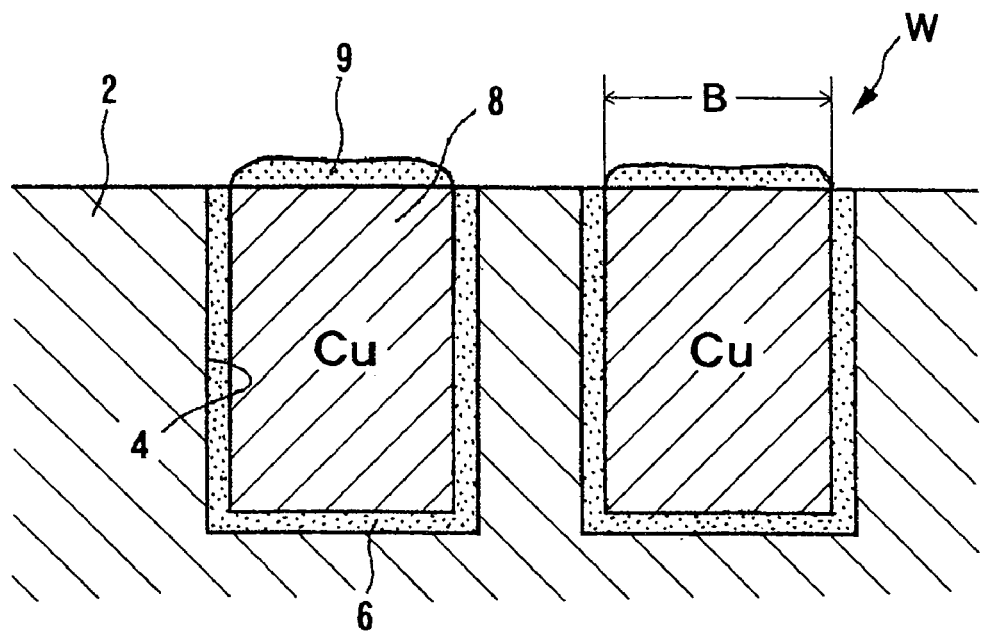
F I G. 2
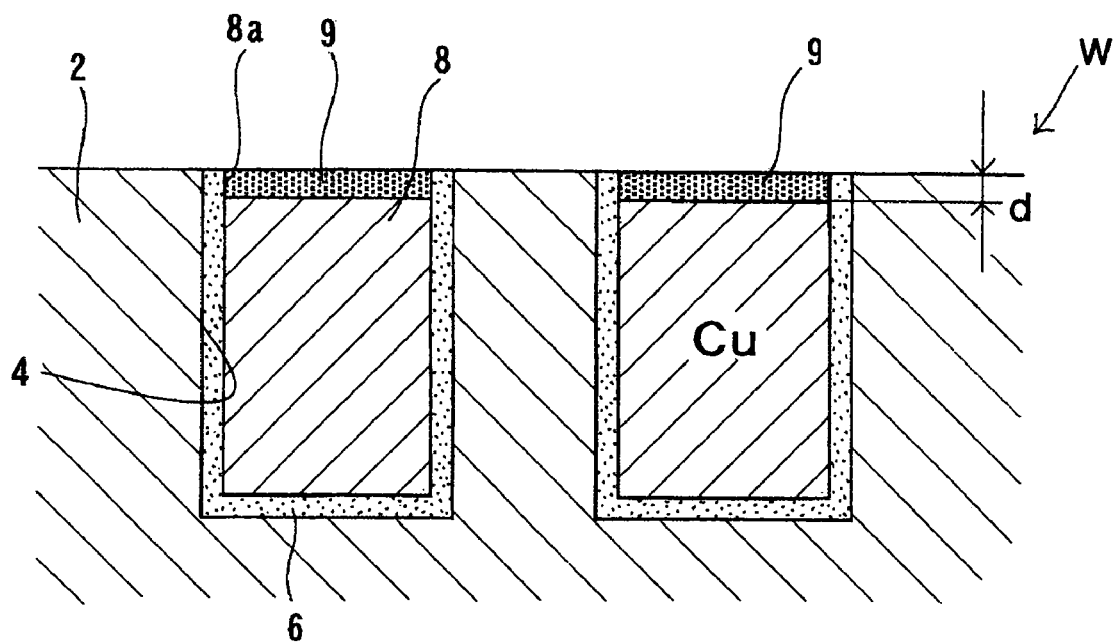

F I G. 2 1 A
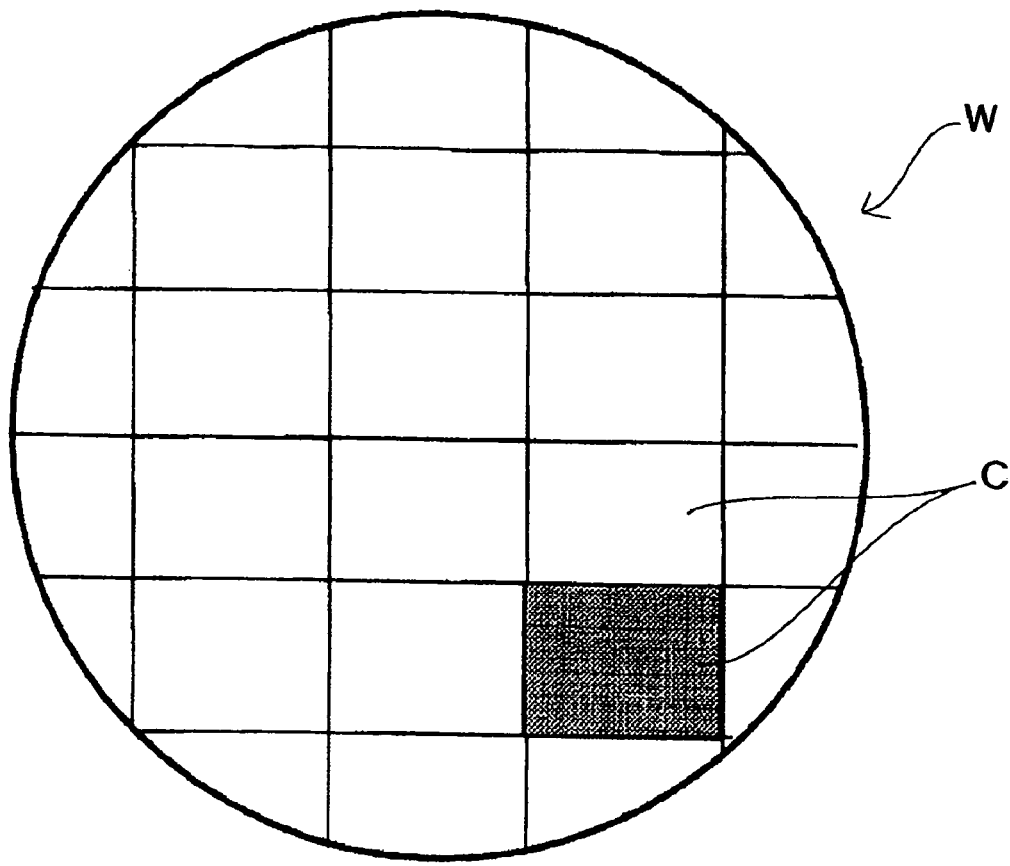
F I G. 2 1 B
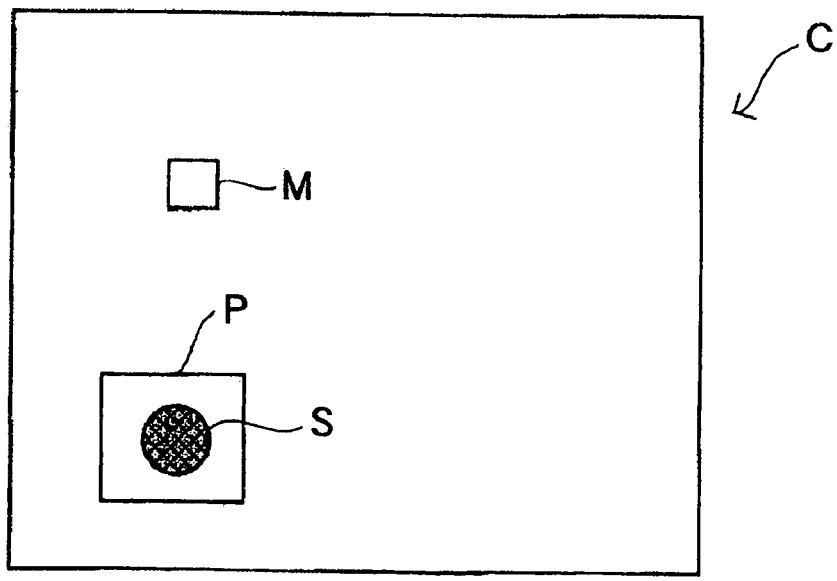

SUBSTRATE PROCESSING METHOD

BACKGROUND OF THE INVENTION

1. Field of the Invention

This invention relates to a substrate processing method and apparatus, and more particularly to a substrate processing method and apparatus for protecting interconnects by selectively covering exposed surfaces of embedded interconnects, which have been formed by embedding an electric conductor such as copper in a surface of a substrate such as a semiconductor wafer, with a coating film (protective film) of a metal or an alloy.

The present invention also relates to a substrate processing method and apparatus for caving in exposed surfaces of embedded interconnects to form recesses, preparatory to selectively covering exposed surfaces of the embedded interconnects, which have been formed by embedding an electric conductor such as copper in a surface of a substrate such as a semiconductor wafer, with a coating film (protective film) of a metal or an alloy.

2. Description of the Related Art

As a process for forming interconnects in a semiconductor device, a so-called "damascene process", which comprises embedding a metal (electric conductor) into interconnect trenches and contact holes, is coming into practical use. According to this process, aluminum, or more recently a metal such as silver or copper, is embedded into interconnect trenches and contact holes previously formed in an interlevel dielectric of a semiconductor substrate. Thereafter, an extra metal is removed by chemical mechanical polishing (CMP) so as to flatten a surface of the substrate.

In a case of interconnects formed by such a process, for example, copper interconnects are formed by using copper as an interconnect material, and embedded copper interconnects have an exposed surface after flattening processing. In order to prevent thermal diffusion of such interconnects (copper), or to prevent oxidation of such interconnects (copper) or to improve electromigration (EM) properties by enhancing adhesion, e.g. in forming thereon an insulating film (oxide film) under an oxidizing atmosphere to produce a semiconductor device having a multi-layer interconnect structure, it is now under study to selectively cover exposed surfaces of interconnects with a coating film (cap material) composed of a Co alloy, a Ni alloy or the like so as to prevent thermal diffusion and oxidation of the interconnects. Such a film of a Co alloy, a Ni alloy or the like can be produced e.g. by electroless plating. Further, in order to form a flat coating film on the exposed surfaces of interconnects, a processing method is being studied which comprises caving in the exposed surfaces of embedded interconnects to form recesses. The recesses may be formed, for example, by etching or wet polishing.

Consider now an example of selective formation of a coating film (protective film) as illustrated in FIG. 1. In particular, fine interconnect recesses 4 are first formed in an insulating film 2 of e.g. $SiO_2$, SiCO, SiOF, or an inorganic or organic low-k material, deposited on a surface of a substrate W, such as a semiconductor wafer. After forming a barrier layer 6 of TaN or the like on an entire surface, copper plating, for example, is performed to form a copper film on a surface (barrier layer 6) of the substrate W so that the recesses 4 are filled with copper. Thereafter, the surface of the substrate W is flattened by CMP (chemical-mechanical polishing), thereby forming interconnects 8 composed of copper film in the insulating film 2. A coating film (cap material) 9 of a Co—W—P alloy is formed, e.g. by electroless plating, selectively on surfaces of interconnects (copper film) 8 to protect interconnects 8.

In the above case, the interconnects 8 of metal (copper) and the insulating film 2 of insulating material are exposed on the surface of the substrate W, and it is necessary to selectively form the coating film 9 only on the exposed surfaces of the interconnects 8. When the coating film 9 is selectively formed only on the exposed surfaces of the interconnects 8, which are formed in a pattern of long narrow lines separated from each other by the insulating film 2, the coating film 9 will take the form of a number of separate discontinuous films and film properties are likely to vary. It is therefore required to control the coating film 9 so that film thickness and/or film properties are constant.

When forming the coating film 9 such that its surface is flush with the surface of the insulating film 2, as shown in FIG. 2, it is necessary to cave in the surfaces of the interconnects 8 to form recesses 8a preparatory to the formation of coating film 9. In this case, in addition to control of the thickness of the coating film 9, it is necessary to precisely control a depth of the recesses 8a formed above the interconnects 8.

SUMMARY OF THE INVENTION

For a continuous thin film formed over a surface of a semiconductor substrate, for example, it is possible to measure thickness or properties of the film by using a common optical or electric resistance-type sensor. For the above-described discontinuous film selectively covering interconnects or to be cut, however, measurement of the film with a conventional sensor is difficult, and it is required to quickly measure the thickness or properties of such a film in a non-destructive manner. In this connection, it is possible at present to prepare a calibration curve in advance by using a destructive measurement method, such as TEM (transmission electron microscopy), and perform processing while maintaining process conditions based on the calibration curve. This method, however, is not practicable in view of cost and time involved.

Further, in some instances, a method is utilized in which a pilot wafer with a simulated structure of an intended measurement portion is subjected to the same processing and the film thickness or properties are measured indirectly, and results of this measurement are utilized to control an actual process. It is, however, not generally practiced to perform a direct measurement on a substrate formed device as a processing object for adjustment of the process conditions, and the like. Wet processings, such as plating, etching and electrolytic polishing, often use a liquid chemical comprising a number of chemical components, and it is difficult to monitor and control with accuracy all the components in the liquid chemical. Further, in processing of a film on discontinuous exposed metal surfaces, the film thickness or properties may vary with location depending upon differences in a size or an initial state of the exposed surfaces. There is, therefore, a desire to maintain conditions of apparatus and liquid chemical, and directly monitor and control a film being processed or to be processed so that a high-quality film processing can be effected.

The present invention has been made in view of the above situation in the related art. It is therefore an object of the present invention to provide a substrate processing method and apparatus which can measure and monitor a thickness and/or properties of a film formed on a substrate as needed, and quickly correct a deviation in process conditions, and which can therefore stably provide a product of constant quality.

In order to achieve this object, the present invention provides a substrate processing method for processing a substrate having a metal and an insulating material exposed on its surface in such a manner that film thickness of a metal portion, with an exposed surface of the metal as a reference plane, is selectively or preferentially changed, comprising: measuring a change in the film thickness and/or a film property of the metal portion during and/or immediately after processing; and monitoring processing and adjusting processing conditions based on results of this measurement.

According to the substrate processing method, a film thickness and/or film property of a processed film is measured during and/or after processing, and a film thickness and/or film property is controlled. Thus, the method enables direct measurement and control on a device substrate. This ensures quality of the film even when the film thickness or property has changed with time after continued film processing, and makes it possible to provide a stable product.

The processing may be film formation which increases the film thickness of the metal portion or film formation in which a different material is superimposed on the metal.

Alternatively, the processing may be etching or heat processing which decreases the film thickness of the metal portion.

In a preferred embodiment of the present invention, measurement of a change in the film thickness and/or the film property of the metal portion is performed on a particular measurement area by using an optical sensor which is orientable to any point on the substrate. By setting a particular area at the same position on each substrate as a control target, variations in quality between substrates can be prevented.

In a preferred embodiment of the present invention, measurement of a change in the film thickness and/or the film property of the metal portion is performed on a plurality of measurement areas simultaneously or sequentially by using an optical sensor which is orientable to any point on the substrate. By setting a plurality of areas on a substrate as control targets, variations in quality in the substrate can be prevented.

The optical sensor may be one which utilizes spectroreflectometry, ellipsometry or spectroscopic ellipsometry. With such an optical sensor, measurement can be performed in a non-destructive manner, i.e. without destroying a substrate, and in a short time of about several seconds to several tens of seconds for one measurement area. This is desirable in light of quality control.

The optical sensor may also be one which utilizes X-ray reflectance, grazing-incidence fluorescent X-rays or a plurality of laser interferometers. Such an optical sensor enables real-time measurement of a change in the film thickness and/or the film property of a film being processed (measurement object) in air or in a liquid.

The present invention also provides a substrate processing method for processing a substrate having a metal and an insulating material exposed on its surface in such a manner that film thickness of a metal portion, with an exposed surface of the metal as a reference plane, is selectively or preferentially changed, comprising: setting on the substrate a measurement area, in which measurement of a change in the film thickness of the metal portion is possible, and a target area as a control target; preparing a calibration curve showing a relationship between a change in the film thickness of the metal portion in the measurement area and a change in a film thickness of the metal portion in the target area; measuring the film thickness in the measurement area during and/or immediately after processing; and converting this measured value to the film thickness of the metal portion in the target area by using the calibration curve to monitor and adjust a change in the film thickness.

Take film formation on exposed surfaces of interconnects for example. When selectively covering the exposed surfaces of interconnects with a coating film (protective film), device performance is generally governed primarily by a coating film (protective film) formed on the interconnects. Accordingly, it is most important to control properties of the coating film formed on the interconnects. It is, however, difficult to directly measure a film thickness of the coating film on the interconnects, because the interconnects generally have a width of not more than 1 μm. Even with a continuous coating film having a relatively wide area, film properties may vary at various portions depending upon sizes. According to the above substrate processing method, therefore, a measurement area in which measurement of the film thickness of e.g. a coating film is possible and a target area as a control target are set on a substrate, the film thickness of the coating film formed in the measurement area is measured, and this measured value is converted to the film thickness of the coating film in the target area by using a prepared calibration curve showing a relationship between the film thickness of the coating film in the measurement area and the film thickness of the coating film in the target area. This makes it possible to indirectly determine the film thickness of a coating film, whose measurement is generally impossible, formed on interconnects.

Also in a case of cutting a coating film (protective film) formed on exposed surfaces of interconnects, a decrease in film thickness can be determined indirectly in the same manner as described above.

In a preferred embodiment of the present invention, the film thickness of the metal portion is measured by an optical sensor, and the measurement area is sufficiently larger for measurement than a spot size of an optical beam emitted from the optical sensor.

In measurement of the film thickness by an optical film thickness sensor (optical sensor), a spot size of a sensor beam, after narrowing the beam, is generally from several μm to several tens of μm. On the other hand, a width of interconnects is generally not more than 1 μm as described above. Accordingly, when attempting to directly measure the film thickness of a coating film formed on interconnects, this measurement is influenced by an adjacent insulating film (insulating material) whose surface is exposed. This will produce a large measurement error and, in some cases, make measurement impossible. By setting (selecting) a measurement area which has a larger size than a spot size of a narrowed optical beam from the optical sensor and on which a continuous film is to be formed, it becomes possible to measure the film thickness of a film formed on the substrate without being influenced by an insulating film (insulating material). Such a measurement area can be set at a desired position on a substrate. In case there is no proper measurement area on a substrate, it can be dealt with by making a dummy pattern.

The present invention also provides a substrate processing method for processing a substrate having a metal and an insulating material exposed on its surface in such a manner that a coating film is formed selectively on an exposed surface of the metal, comprising: setting on the substrate a measurement area, in which measurement of a film property of the coating film is possible, and a target area as a control target; preparing a calibration curve showing a relationship between a film property of the coating film in the measurement area and the film property of the coating film in the target area; measuring the film property in the measurement area during and/or immediately after formation of the coating film; and converting this measured value to the film property of the coating film in the target area by using the calibration curve to monitor and adjust formation of the coating film.

As with the above-described case of measuring the film thickness of a coating film, film properties of a coating film formed on interconnects, whose measurement is generally impossible, can be determined in an indirect manner according to the present substrate processing method.

The film property of the coating film may be at least one of film composition, density, refractive index, surface roughness, reflectance and interface width.

In a preferred embodiment of the present invention, the film property of the coating film is measured by an optical sensor, and the measurement area is sufficiently larger than the spot size of an optical beam emitted from the optical sensor.

The present invention further provides a substrate processing apparatus comprising: a plating unit for plating a substrate having a metal and an insulating material exposed on its surface in such a manner that a coating film is formed selectively on an exposed surface of the metal; a sensor for measuring film thickness and/or a film property of the coating film during and/or immediately after formation of the coating film; and a control section for controlling the plating unit based on an output from the sensor.

The present invention further provides a substrate processing apparatus comprising: an etching unit for etching a substrate having a metal and an insulating material exposed on its surface in such a manner that an exposed surface of the metal is selectively removed; a sensor for measuring a decrease in film thickness of a metal portion during and/or immediately after removal processing of the metal portion; and a control section for controlling the etching unit based on an output from the sensor.

The present invention further provides a substrate processing apparatus comprising: a polishing unit for polishing a substrate having a metal and an insulating material exposed on its surface in such a manner that an exposed surface of the metal is selectively removed; a sensor for measuring a decrease in film thickness of a metal portion during and/or immediately after removal processing of the metal portion; and a control section for controlling the polishing unit based on an output from the sensor.

BRIEF DESCRIPTION OF THE DRAWINGS

FIG. 1 is a cross-sectional diagram illustrating an example of formation of a coating film on interconnects by electroless plating;

FIG. 2 is a cross-sectional diagram illustrating another example of formation of a coating film on interconnects by electroless plating;

FIG. 21A is a diagram illustrating a relationship between a substrate and regions each defining a chip, and FIG. 21B is a diagram illustrating a relationship between a measurement area and a target area in a region defining a chip;

DETAILED DESCRIPTION OF THE PREFERRED EMBODIMENTS

Preferred embodiments of the present invention will now be described in detail with reference to the drawings.

Figure 3:
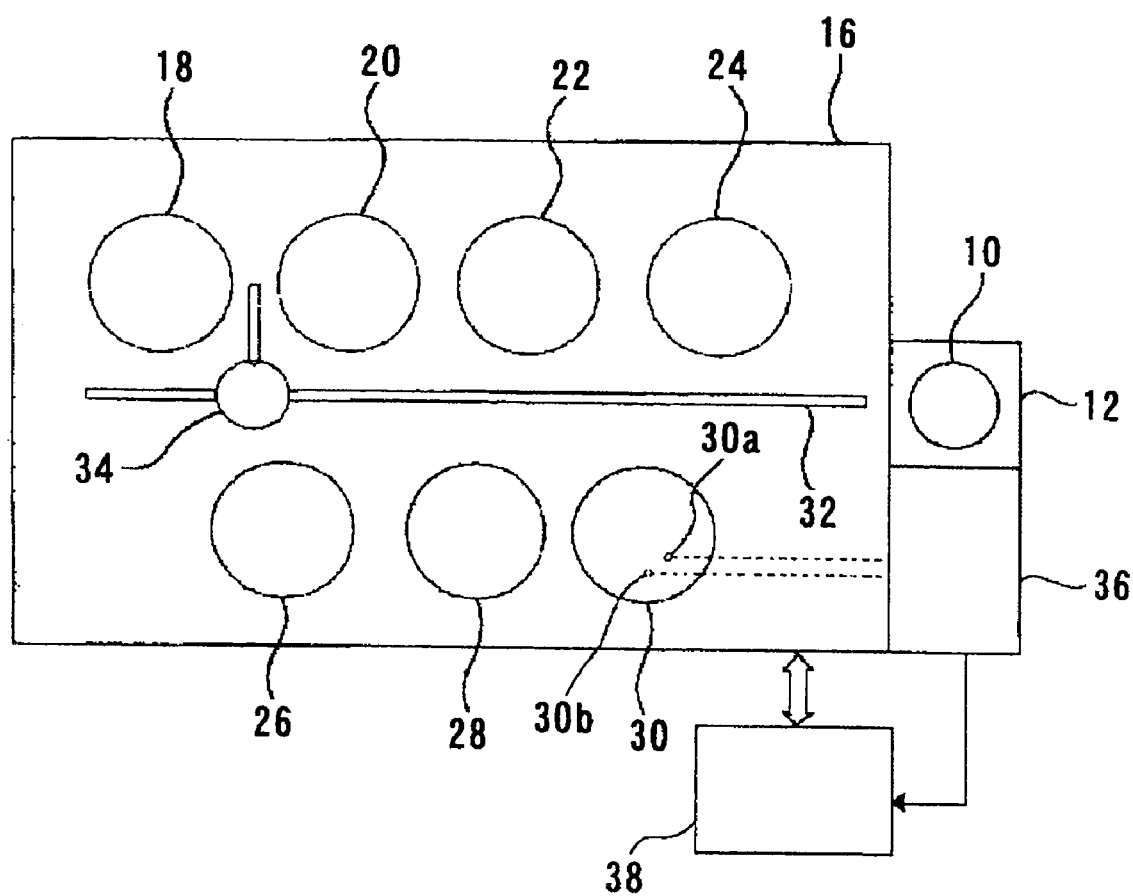
FIG. 3 is a layout plan of a substrate processing apparatus according to an embodiment of the present invention.

FIG. 3 shows a layout plan of a substrate processing apparatus according to an embodiment of the present invention. As shown in FIG. 3, the substrate processing apparatus includes a loading/unloading unit 12 housing a substrate cassette 10 that houses substrates W each having interconnects 8 of e.g. copper formed in interconnect recesses 4 which are formed in a surface (see FIG. 1). Along one long side of a rectangular housing 16 provided with a ventilation system, there are disposed in series a first pre-treatment unit 18 for performing cleaning of the surface of a substrate W as a pre-plating treatment, a second pre-treatment unit 20 for imparting a catalyst to exposed surfaces of interconnects 8 after cleaning to activate surfaces of interconnects, an electroless plating unit 22 for performing electroless plating of the surface (processing surface) of the substrate W, and a post-treatment unit 24 for performing a post-plating treatment of the substrate W to enhance selectivity of a coating film (protective film) 9 (see FIG. 1) which has been formed by the electroless plating on the surfaces of the interconnects 8.

Further, along another long side of the housing 16 are disposed in series a drying unit 26 for drying the substrate W after post-treatment, a heat treatment unit 28 for heat treating (annealing) the substrate W after drying, and a measurement unit 30 provided with a film thickness sensor 30a for measuring a film thickness of the coating film (protective film) 9 formed on the surfaces of the interconnects 8 and with a film property sensor 30b for measuring a film property of the coating film 9. Further, a transport robot 34, which is movable on a rail 32 parallel to the long sides of the housing 16 and transfers a substrate between it and each unit or the substrate cassette 10 set in the loading/unloading unit 12, is disposed centrally between these two lines of units. Output signals from the film thickness sensor 30a and the film property sensor 30b are inputted into a control section 36, and the units, the transport robot and a chemical supply control unit 38 are controlled by output signals from the control section 36.

The housing 16 is light-shielded so as to inhibit transmission therethrough of external light. This prevents migration of electrons, due to an excitation effect of light, in devices and interconnects formed in a device surface of a substrate during processing, thus preventing damage to the devices in the substrate.

Details of the various units provided in the substrate processing apparatus shown in FIG. 3 will now be described.

The first pre-treatment unit 18 and the second pre-treatment unit 20 both employ the same two-liquid separation system for preventing mixing of two liquids though processing liquids (liquid chemicals) used are different. These units each hold a substrate W, which has been transported face down thereto, by sealing a peripheral portion of a lower surface, which is a processing surface (front surface), and pressing on a back surface.

As shown in FIGS. 5 to 8, the pre-treatment unit 18, 20 each includes a fixed frame 52 that is mounted on an upper part of a frame 50, and a movable frame 54 that moves up and down relative to the fixed frame 52. A processing head 60, which includes a bottomed cylindrical housing portion 56, opening downwardly, and a substrate holder 58, is suspended from and supported by the movable frame 54. In particular, a servomotor 62 for rotating the head is mounted to the movable frame 54, and the housing portion 56 of the processing head 60 is coupled to a lower end of a downward-extending output shaft (hollow shaft) 64 of the servomotor 62.

Figure 8:
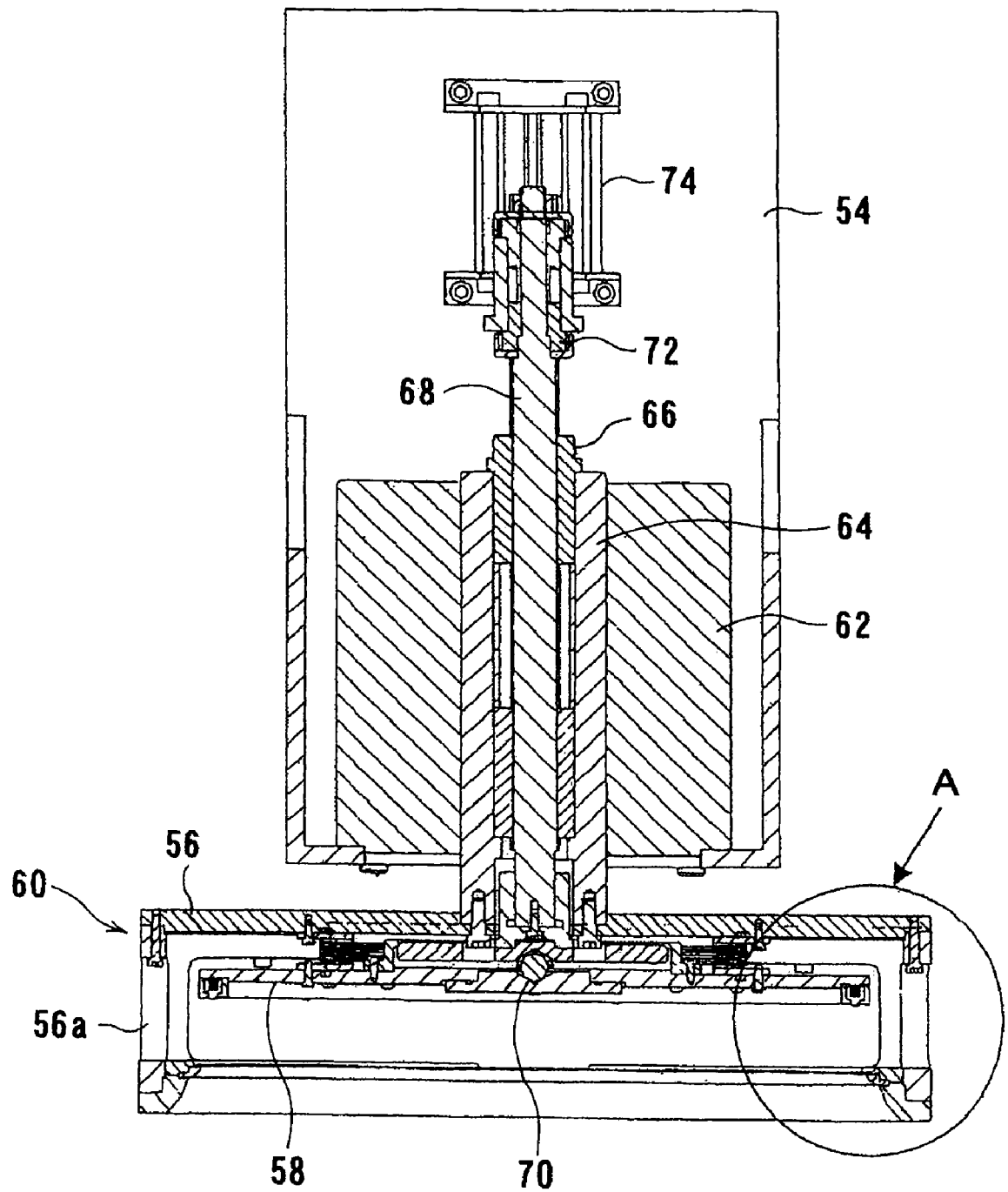
FIG. 8 is a cross-sectional view showing a processing head of the pre-treatment unit upon transfer of a substrate.

As shown in FIG. 8, a vertical shaft 68, which rotates together with the output shaft 64 via a spline 66, is inserted in the output shaft 64, and the substrate holder 58 of the processing head 60 is coupled to a lower end of the vertical shaft 68 via a ball joint 70. The substrate holder 58 is positioned within the housing portion 56. An upper end of the vertical shaft 68 is coupled via a bearing 72 and a bracket to a fixed ring-elevating cylinder 74 secured to the movable frame 54. Thus, by actuation of the cylinder 74, the vertical shaft 68 moves vertically independently of the output shaft 64.

Linear guides 76, which extend vertically and guide vertical movement of the movable frame 54, are mounted to the fixed frame 52, so that by actuation of a head-elevating cylinder (not shown), the movable frame 54 moves vertically by guidance of the linear guides 76.

Figure 9:
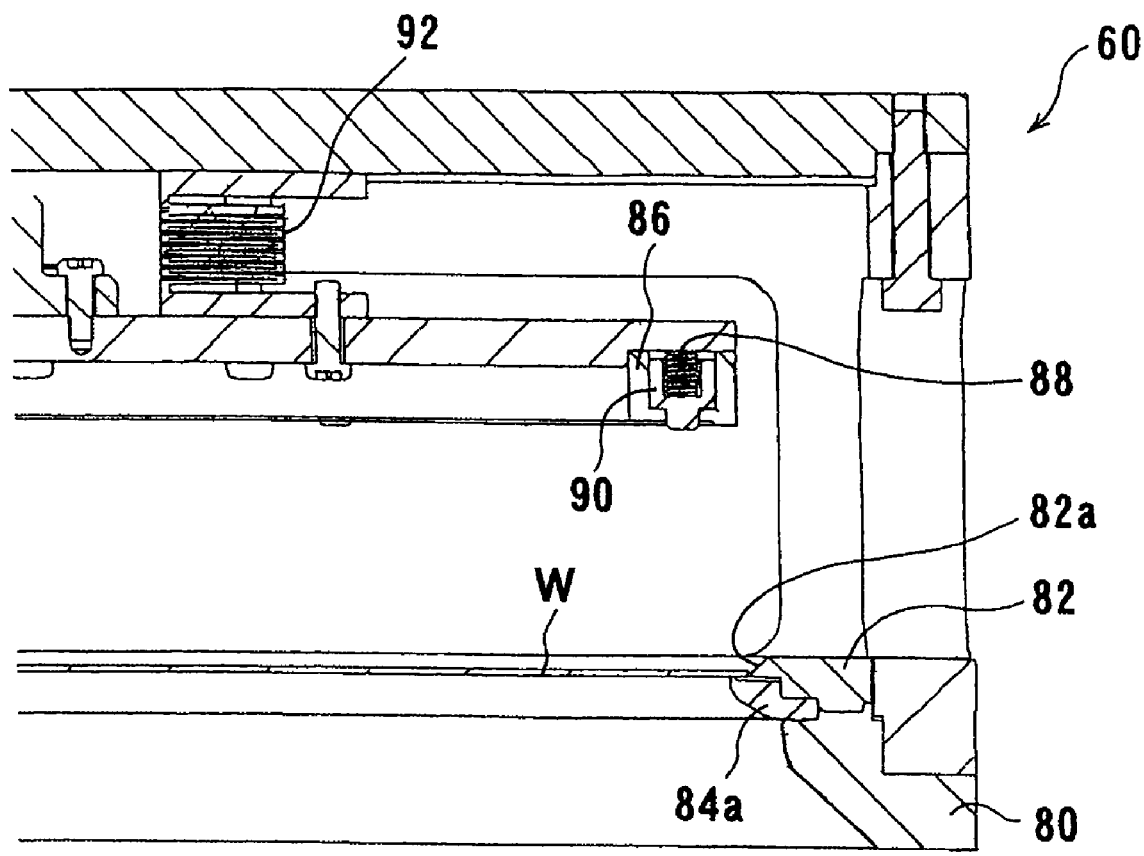
FIG. 9 is an enlarged view of portion A of FIG. 8.
Figure 10:
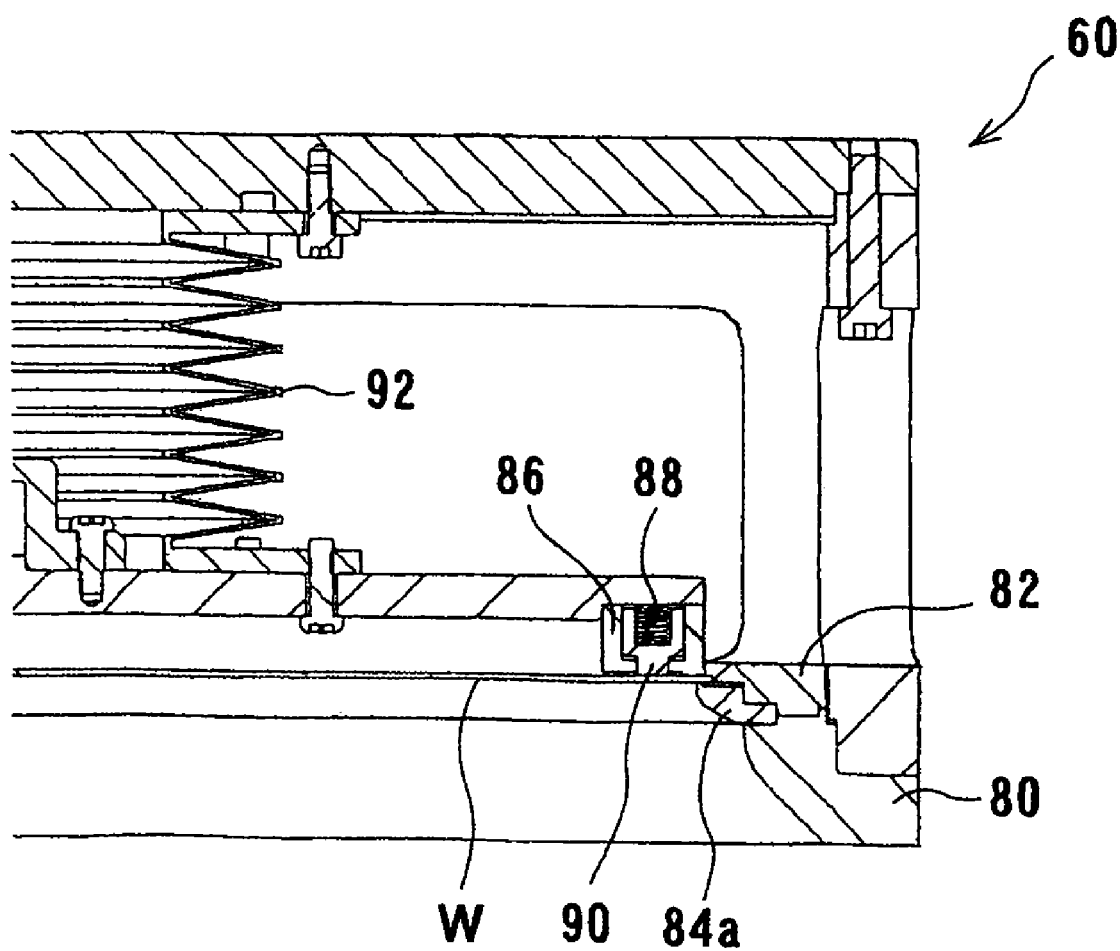
FIG. 10 is a view corresponding to FIG. 9, showing the processing head upon fixing of a substrate.

Substrate insertion windows 56a for inserting the substrate W into the housing portion 56 are formed in a circumferential wall of the housing portion 56 of the processing head 60. Further, as shown in FIGS. 9 and 10, a seal ring 84a is provided in a lower portion of the housing portion 56 of the processing head 60, with an outer peripheral portion of the seal ring 84a being sandwiched between a main frame 80 made of e.g. PEEK and a guide frame 82 made of e.g. polyethylene. The seal ring 84a is provided to make contact with a peripheral portion of the lower surface of the substrate W to seal the peripheral portion.

On the other hand, a substrate fixing ring 86 is fixed to a peripheral portion of a lower surface of the substrate holder 58. A columnar pusher 90 protrudes downwardly from a lower surface of the substrate fixing ring 86 by an elastic force of a spring 88 disposed within the substrate fixing ring 86 of the substrate holder 58. Further, a flexible cylindrical bellows-like plate 92 made of e.g. Teflon (registered trademark) is disposed between an upper surface of the substrate holder 58 and an upper wall of the housing portion 56 to hermetically seal therein.

When the substrate holder 58 is in a raised position, a substrate W is inserted from the substrate insertion window 56a into the housing portion 56. The substrate W is then guided by a tapered surface 82a provided on an inner circumferential surface of the guide frame 82, and positioned and placed at a predetermined position on an upper surface of the seal ring 84a. In this state, the substrate holder 58 is lowered so as to bring the pushers 90 of the substrate fixing ring 86 into contact with the upper surface of the substrate W. The substrate holder 58 is further lowered so as to press the substrate W downwardly by the elastic force of the springs 88, thereby forcing the seal ring 84a to make pressure contact with a peripheral portion of the front surface (lower surface) of the substrate W to seal the peripheral portion while nipping the substrate W between the housing portion 56 and the substrate holder 58 to hold the substrate W.

When head-rotating servomotor 62 is driven while the substrate W is thus held by the substrate holder 58, the output shaft 64 and the vertical shaft 68 inserted in the output shaft 64 rotate together via the spline 66, whereby the substrate holder 58 rotates together with the housing portion 56.

At a position below the processing head 60, there is provided an upward-open treatment tank 100 comprising an outer tank 100a and an inner tank 100b (shown in FIG. 11) that have a slightly larger inner diameter than an outer diameter of the processing head 60. A pair of leg portions 104, which is mounted to a lid 102, is rotatably supported on an outer circumferential portion of the treatment tank 100. Further, a crank 106 is integrally coupled to each leg portion 106, and a free end of the crank 106 is rotatably coupled to a rod 110 of a lid-moving cylinder 108. Thus, by actuation of the lid-moving cylinder 108, the lid 102 moves between a treatment position, at which the lid 102 covers a top opening of the treatment tank 100 and a retreat position beside the treatment tank 100. In a surface (upper surface) of the lid 102, as described below, there is provided a nozzle plate 112 having a large number of jet nozzles 112a for jetting outwardly (upwardly), for example, electrolytic ionic water having reducing power.

Figure 11:
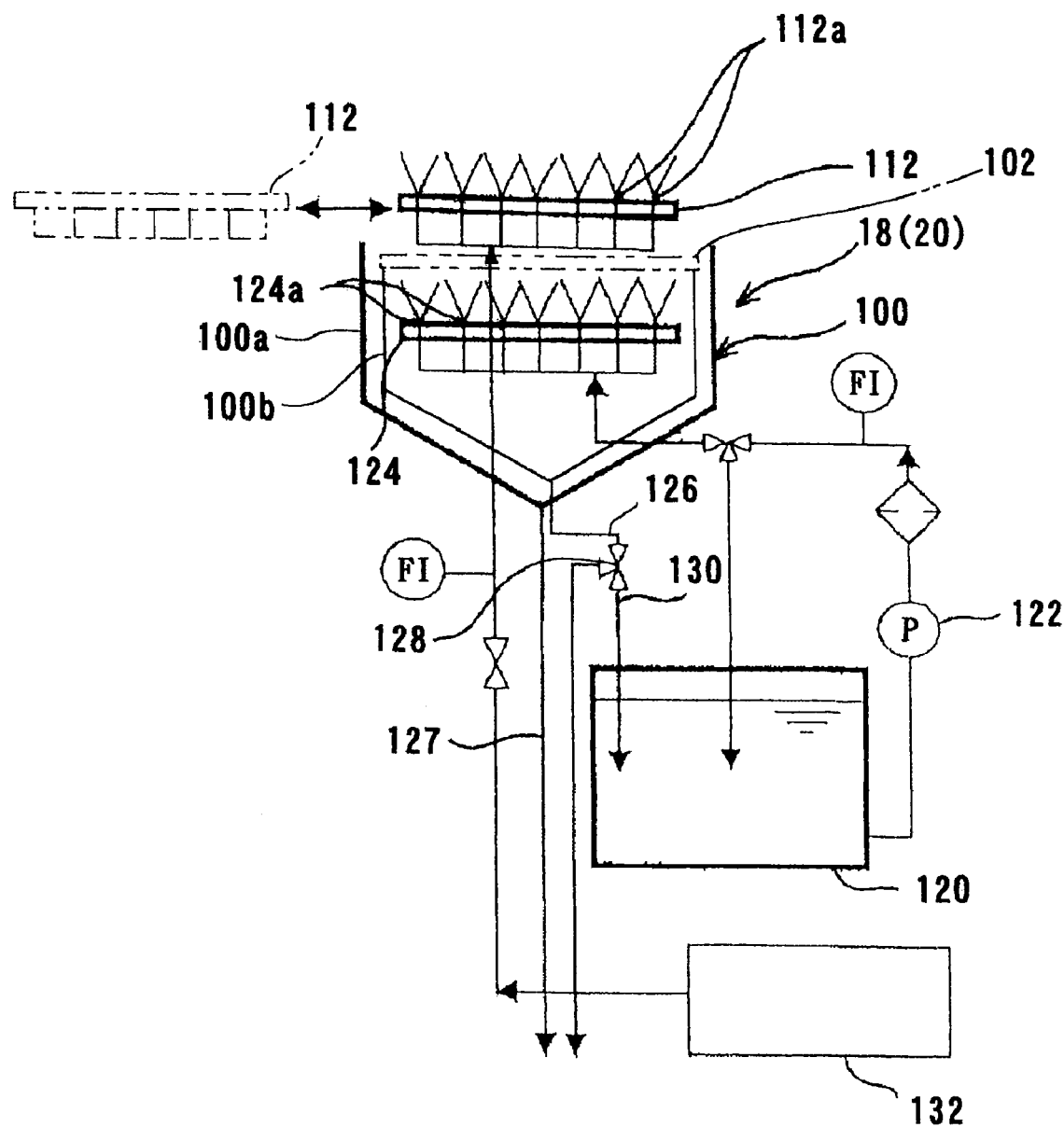
FIG. 11 is a diagram illustrating a system of the pre-treatment unit.

Further, as shown in FIG. 11, a nozzle plate 124 having a plurality of jet nozzles 124a, for jetting upwardly a liquid chemical supplied from a liquid chemical tank 120 by driving the liquid chemical pump 122, is provided in the inner tank 100b of the treatment tank 100 in such a manner that the jet nozzles 124a are equally distributed over an entire surface of a cross section of the inner tank 100b. A drain pipe 126 for draining a liquid chemical (waste liquid) to outside is connected to a bottom of the inner tank 100b. A three-way valve 128 is provided in the drain pipe 126, and the liquid chemical (waste liquid) is returned to the liquid chemical tank 120 through a return pipe 130 connected to one of ports of the three-way valve 128 to recycle the liquid chemical, as needed. Further, in this embodiment, the nozzle plate 112 provided on the surface (upper surface) of the lid 102 is connected to a rinsing liquid supply source 132 for supplying a rinsing liquid such as pure water. Further, a drain pipe 127 is connected to a bottom of the outer tank 100a.

By lowering the processing head 60 holding the substrate so as to cover or close the top opening of the treatment tank 100 with the processing head 60, and then jetting a liquid chemical from the jet nozzles 124a of the nozzle plate 124 disposed in the treatment tank 100 toward the substrate W, the liquid chemical can be jetted uniformly onto an entire lower surface (processing surface) of the substrate W and the liquid chemical can be discharged from the discharge pipe 126 while preventing scattering of the liquid chemical to the outside. Further, by raising the processing head 60 and closing the top opening of the treatment tank 100 with the lid 102, and then jetting a rinsing liquid from the jet nozzles 112a of the nozzle plate 112 disposed in the upper surface of the lid 102 toward the substrate W held in the processing head 60, a rinsing treatment (cleaning treatment) is performed to remove the liquid chemical from the surface of the substrate. Because the rinsing liquid passes through a clearance between the outer tank 10a and the inner tank 100b and is discharged through the drain pipe 127, the rinsing liquid is prevented from flowing into the inner tank 100b and from being mixed with the liquid chemical.

Figure 5:
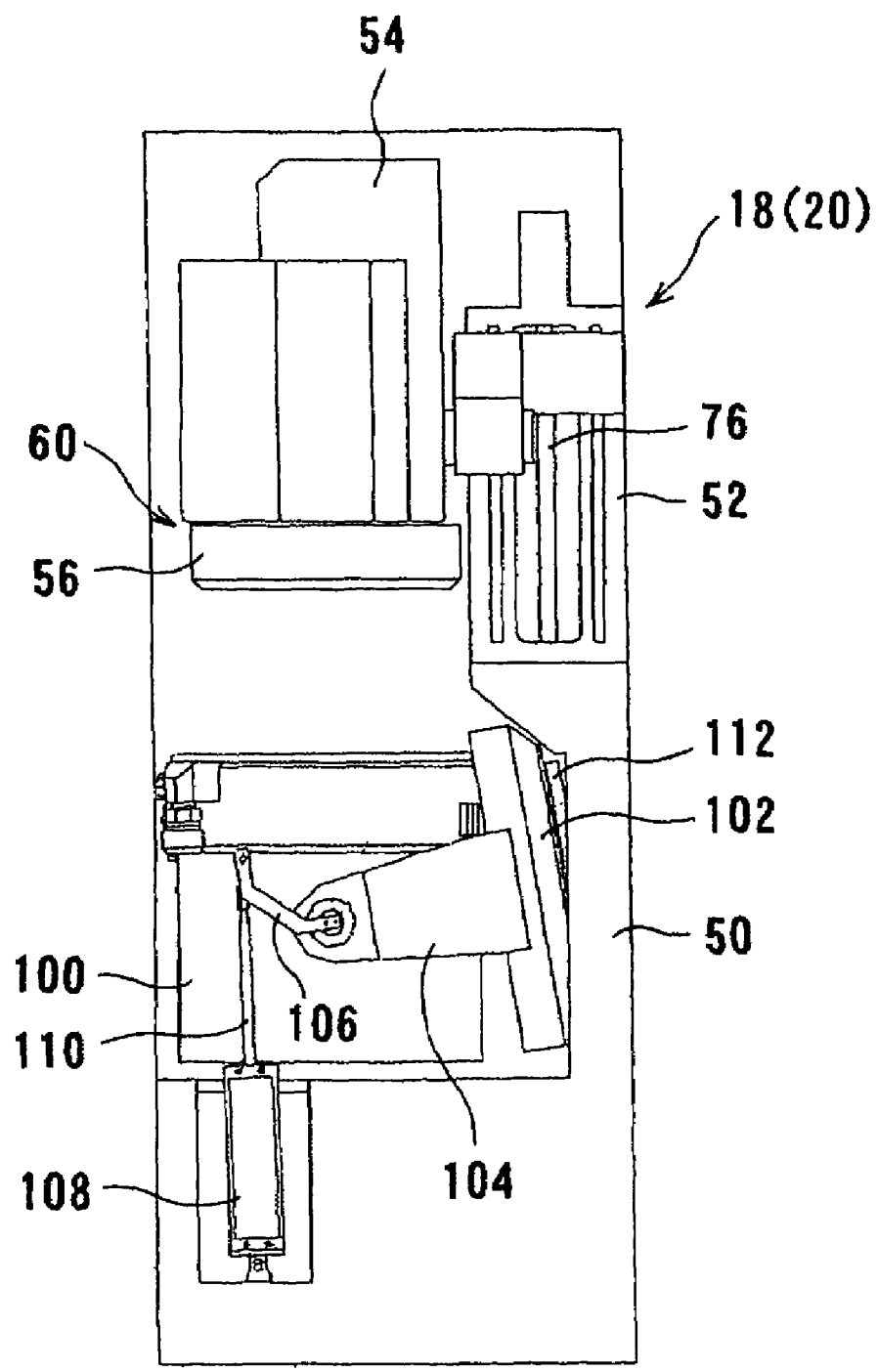
FIG. 5 is a front view showing a pre-treatment unit upon transfer of a substrate.
Figure 6:
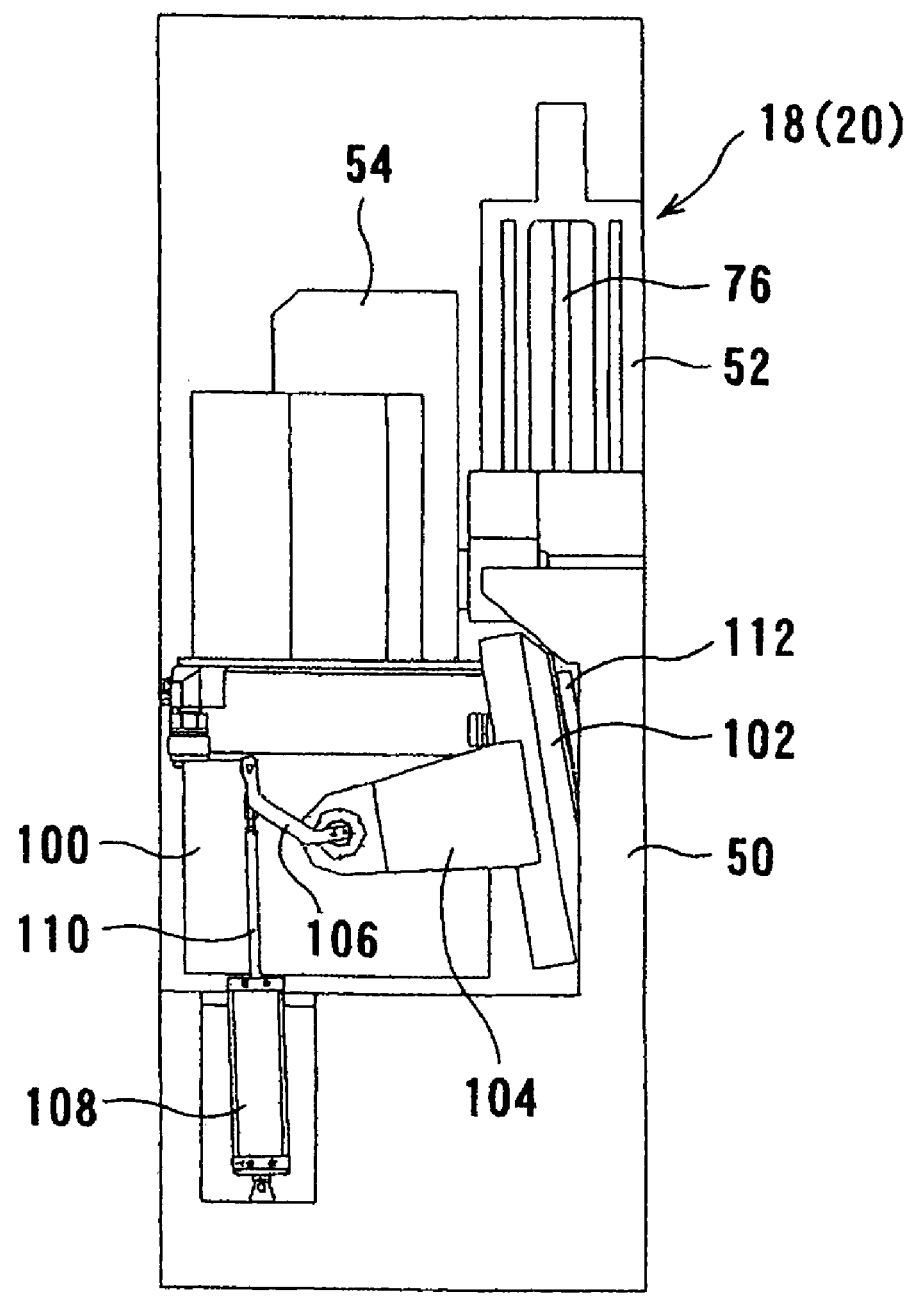
FIG. 6 is a front view showing the pre-treatment unit upon chemical treatment.
Figure 7:
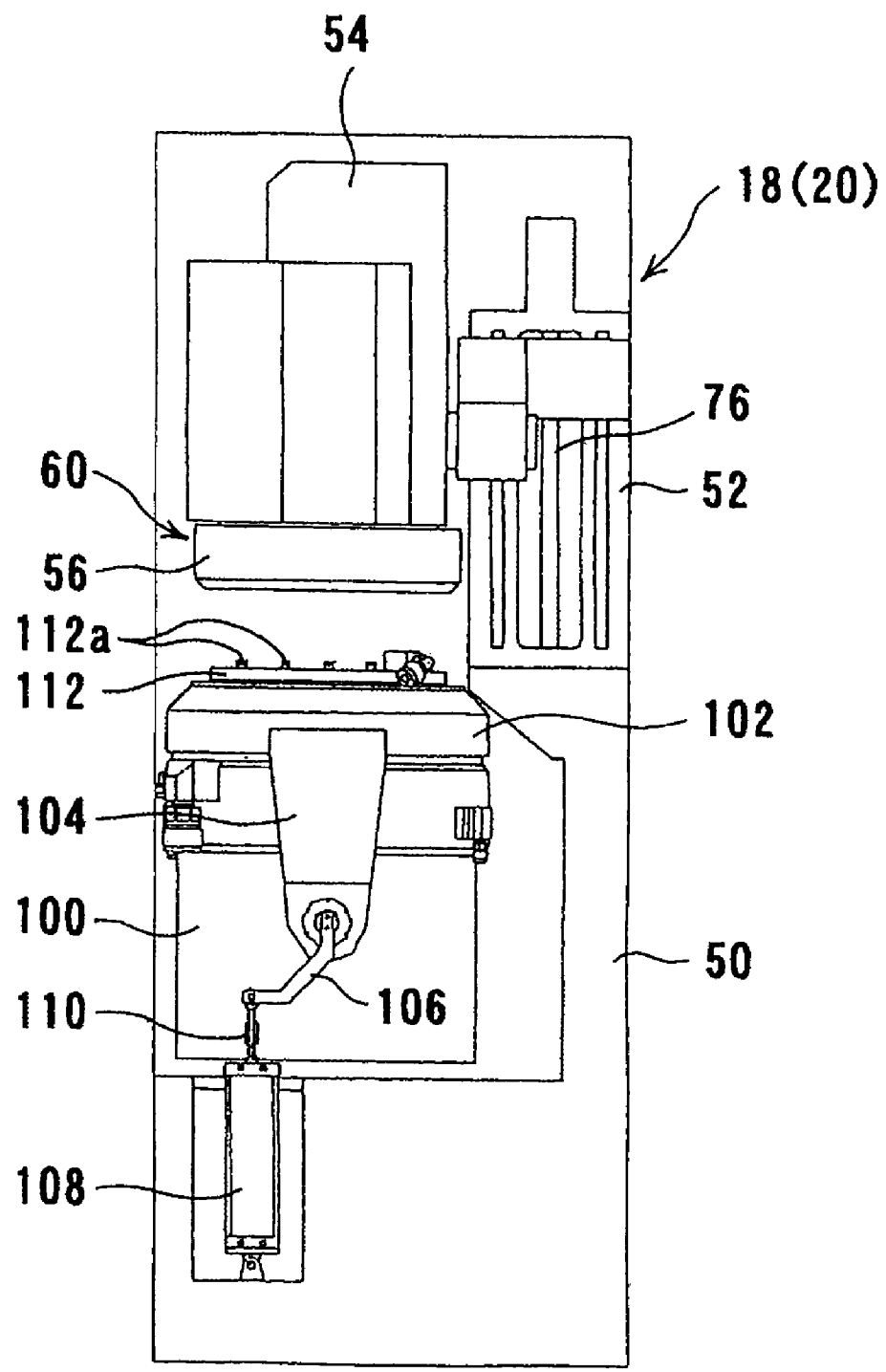
FIG. 7 is a front view showing the pre-treatment unit upon rinsing.

According to the pre-treatment apparatus 18 or 20, the substrate W is inserted into the processing head 60 and held therein when the processing head 60 is in a raised position, as shown in FIG. 5. Thereafter, as shown in FIG. 6, the processing head 60 is lowered to a position at which it covers the top opening of the treatment tank 100. While rotating the processing head 60 and thereby rotating the substrate W held in the processing head 60, a liquid chemical is jetted from the jet nozzles 124a of the nozzle plate 124 disposed in the treatment tank 100 toward the substrate W, thereby jetting the liquid chemical uniformly onto an entire surface of the substrate W. The processing head 60 is raised and stopped at a predetermined position and, as shown in FIG. 7, the lid 102 in a retreat position is moved to a position at which it covers the top opening of the inner tank 100b of the treatment tank 100. A rinsing liquid is then jetted from the jet nozzles 112a of the nozzle plate 112 disposed in the upper surface of the lid 102 toward the rotating substrate W held in the processing head 60. A chemical treatment with the liquid chemical and a rinsing treatment with the rinsing liquid of the substrate W can thus be performed successively while avoiding mixing of these two liquids.

A lowermost position of the processing head 60 may be adjusted to adjust a distance between the substrate W held in the processing head 60 and the nozzle plate 124, whereby a region of the substrate W onto which the liquid chemical is jetted from the jet nozzles 124a of the nozzle plate 124 and a jetting pressure can be adjusted as desired. Here, when a pre-treatment liquid such as a liquid chemical is circulated and reused, active components are reduced by progress of the treatment, and the pre-treatment liquid (liquid chemical) is taken out due to attachment of the treatment liquid to the substrate. Therefore, it is desirable to provide a pre-treatment liquid management unit (not shown) for analyzing composition of the pre-treatment liquid and adding insufficient components.

FIGS. 12 through 18 show an electroless plating unit 22. This electroless plating unit 22 includes a plating tank 200 (see FIG. 18) and a substrate head 204, disposed above the plating tank 200, for detachably holding a substrate W.

Figure 12:
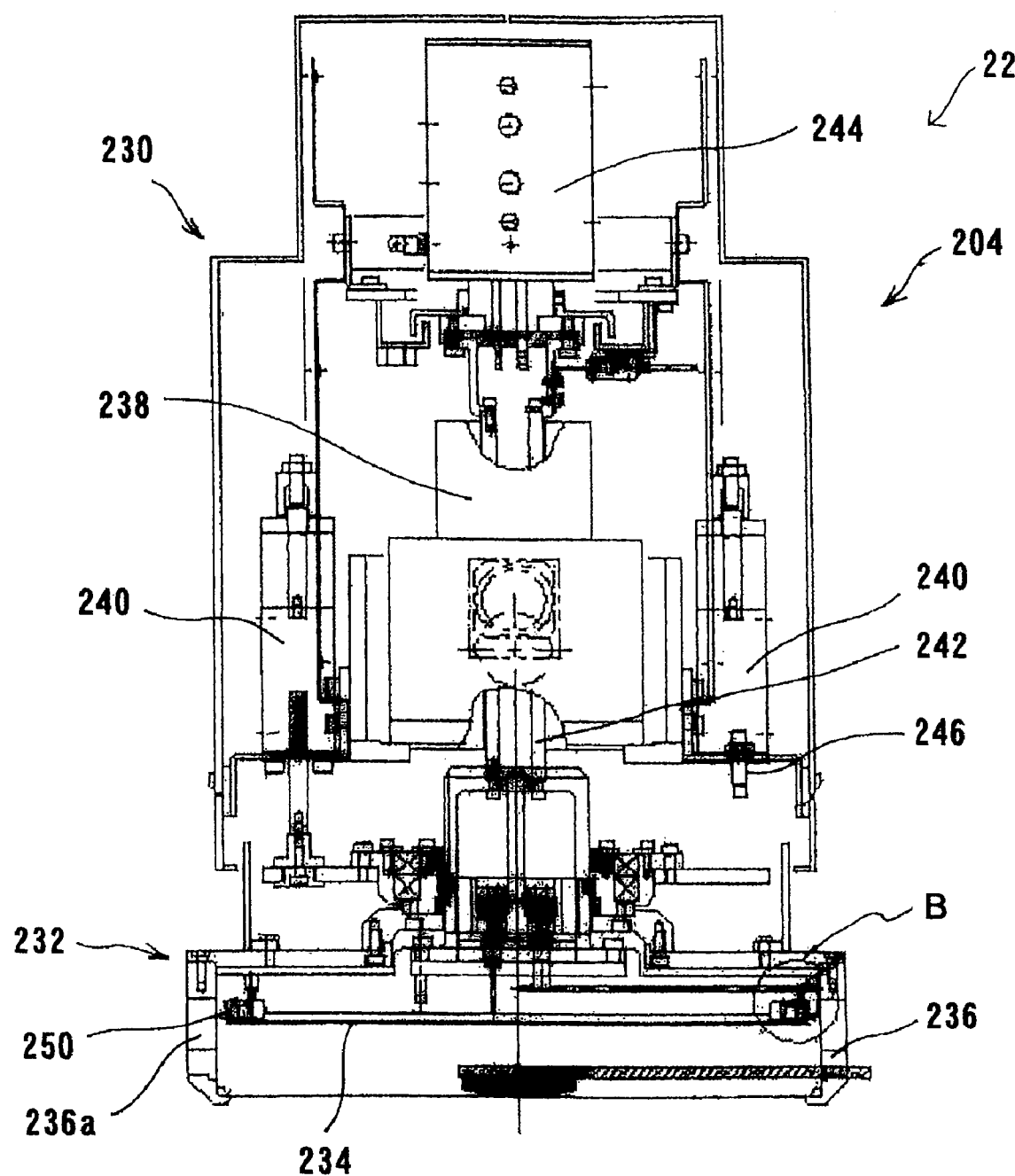
FIG. 12 is a cross-sectional view showing a substrate head of an electroless plating unit upon transfer of a substrate.

As shown in detail in FIG. 12, the processing head 204 has a housing 230 and a head portion 232. The head portion 232 mainly comprises a suction head 234 and a substrate receiver 236 for surrounding the suction head 234. The housing 230 accommodates therein a substrate rotating motor 238 and substrate receiver drive cylinders 240. The substrate rotating motor 238 has an output shaft (hollow shaft) 242 having an upper end coupled to a rotary joint 244 and a lower end coupled to the suction head 234 of the head portion 232. The substrate receiver drive cylinders 240 have respective rods coupled to the substrate receiver 236 of the head portion 232. Stoppers 246 are provided in the housing 230 for mechanically limiting upward movement of the substrate receiver 236.

The suction head 234 and the substrate receiver 236 are operatively connected to each other by a splined structure such that when the substrate receiver drive cylinders 240 are actuated, the substrate receiver 236 vertically moves relative to the suction head 234, and when the substrate rotating motor 238 is driven, the output shaft 242 thereof is rotated to rotate the suction head 234 and the substrate receiver 236 in unison with each other.

Figure 13:
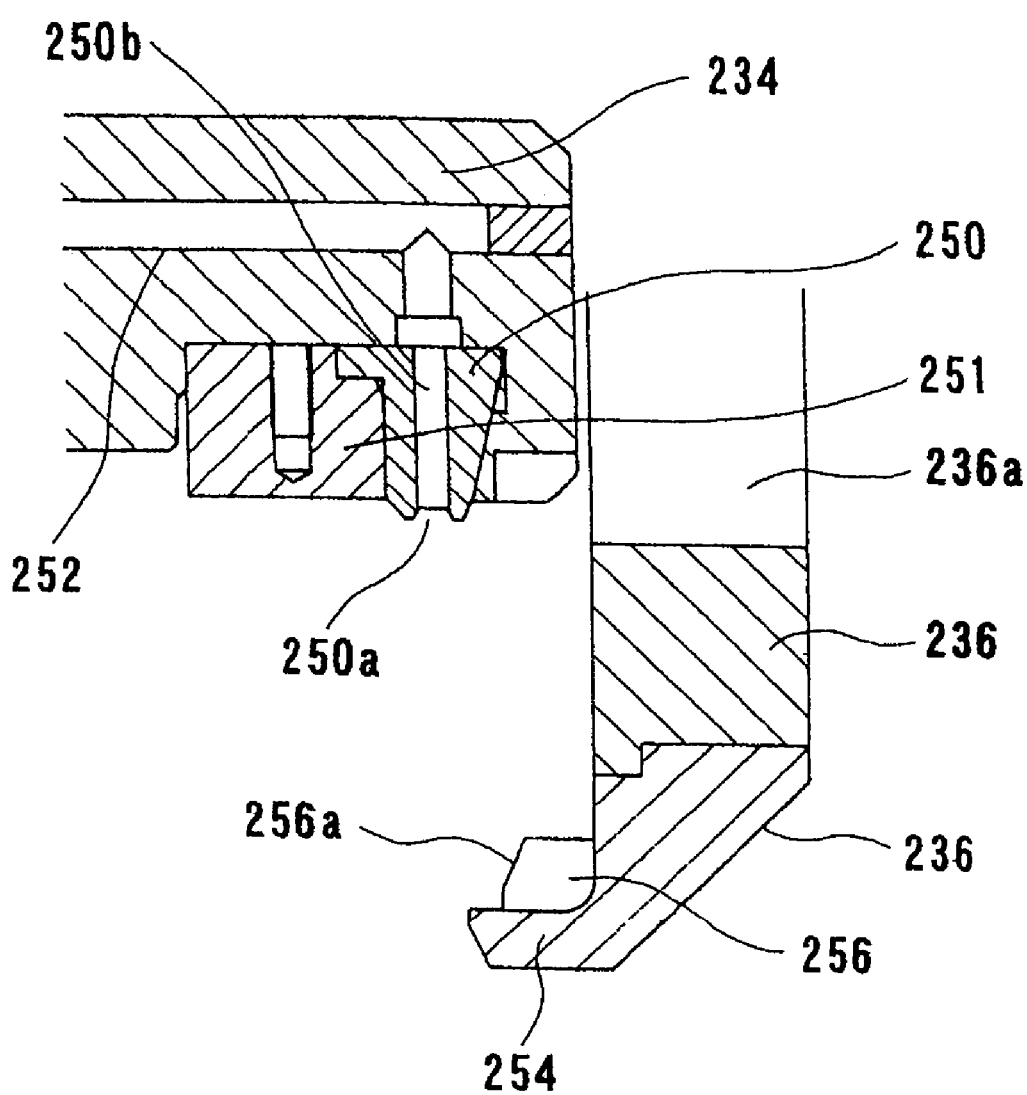
FIG. 13 is an enlarged view of portion B of FIG. 12.
Figure 14:
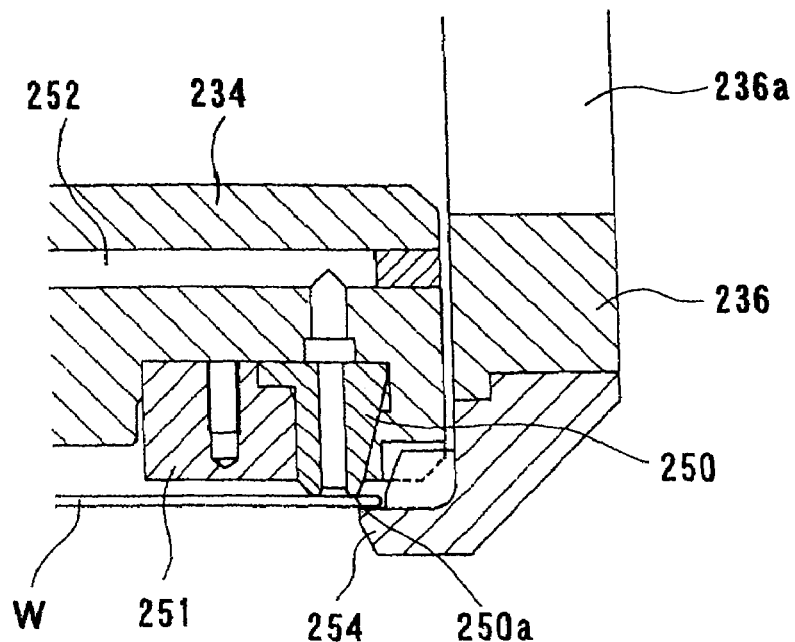
FIG. 14 is a view corresponding to FIG. 13, showing the substrate head of the electroless plating unit upon fixing of a substrate.
Figure 15:
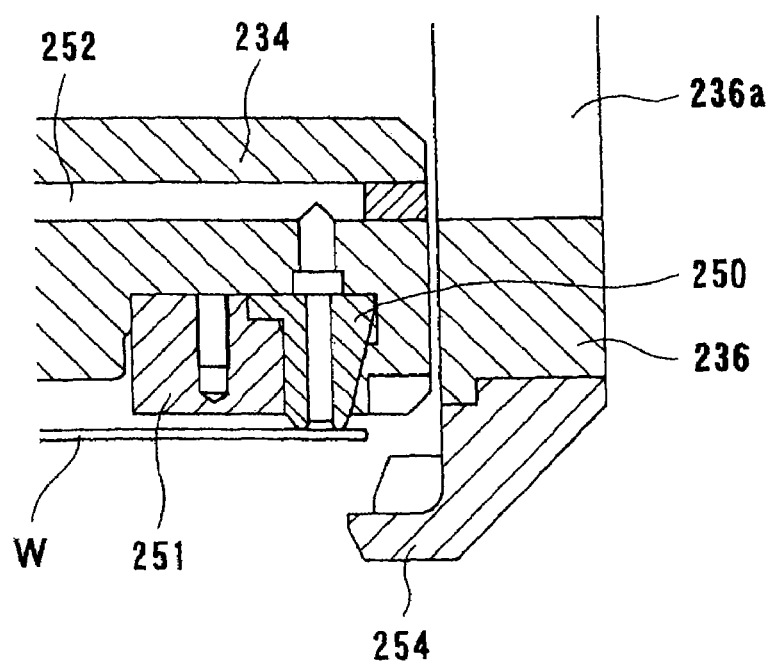
FIG. 15 is a view corresponding to FIG. 13, showing the substrate head of the electroless plating unit upon plating.

As shown in detail in FIGS. 13 through 15, a suction ring 250 for attracting and holding a substrate W against its lower surface to be sealed is mounted on a lower circumferential edge of the suction head 234 by a presser ring 251. The suction ring 250 has a recess 250a continuously defined in a lower surface thereof in a circumferential direction and in communication with a vacuum line 252 extending through the suction head 234 by a communication hole 250b that is defined in the suction ring 250. When the recess 250a is evacuated, the substrate W is attracted to and held by the suction ring 250. Because the substrate W is attracted under vacuum to the suction ring 250 along a radially narrow circumferential area provided by the recess 250a, any adverse effects such as flexing caused by the vacuum on the substrate W are minimized. When the suction ring 250 is dipped in a plating solution (treatment liquid), not only the surface (lower surface) of the substrate W, but also its circumferential edge, can be dipped into the plating solution. The substrate W is released from the suction ring 250 by introducing $N_2$ into the vacuum line 252.

The substrate receiver 236 is in the form of a downwardly open, hollow bottomed cylinder having substrate insertion windows 236a defined in a circumferential wall thereof for inserting therethrough the substrate W into the substrate receiver 236. The substrate receiver 236 also has an annular ledge 254 projecting inwardly from its lower end, and protrusions 256 disposed on an upper surface of the annular ledge 254 and having a tapered inner circumferential surface 256a for guiding the substrate W.

As shown in FIG. 13, when the substrate receiver 236 is lowered, the substrate W is inserted through the substrate insertion window 236a into the substrate receiver 236. The substrate W thus inserted is guided by the tapered surfaces 256a of the protrusions 256 and positioned thereby onto the upper surface of the ledge 254 in a predetermined position thereon. The substrate receiver 236 is then elevated until it brings the upper surface of the substrate W placed on the ledge 254 into abutment with the suction ring 250 of the suction head 234, as shown in FIG. 14. Then, the recess 250a in the vacuum ring 250 is evacuated through the vacuum line 252 to attract the substrate W while sealing an upper peripheral edge surface of the substrate W against a lower surface of the suction ring 250. In order to plate the substrate W, as shown in FIG. 15, the substrate receiver 236 is lowered several mm to space the substrate W from the ledge 254, keeping the substrate W attracted only by the suction ring 250. The substrate W now has its lower peripheral edge surface prevented from not being plated because it is held out of contact with the ledge 254.

Figure 16:
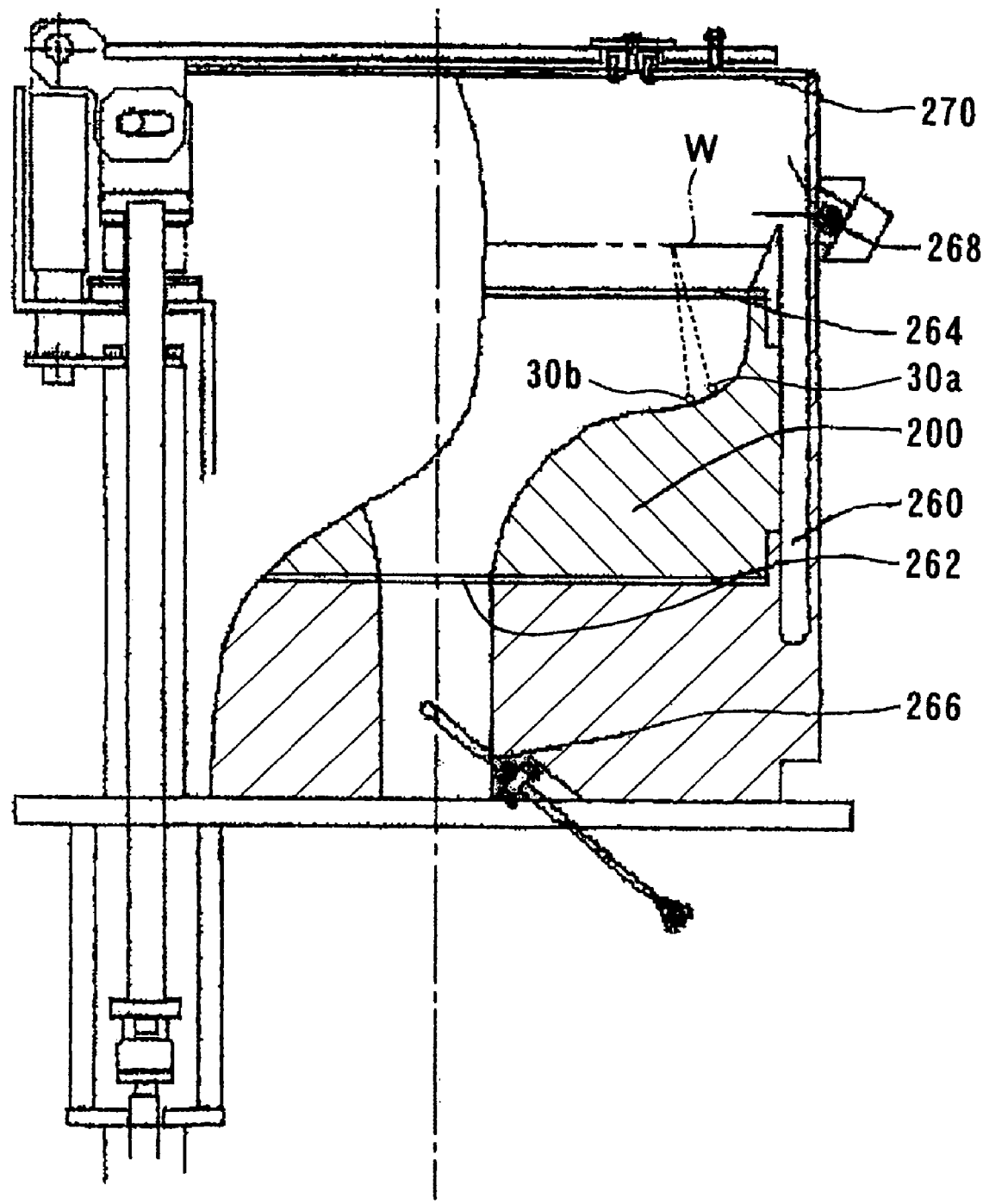
FIG. 16 is a partially sectional front view showing a plating tank of the electroless plating unit when a plating tank cover is closed.

FIG. 16 shows details of the plating tank 200. The plating tank 200 is connected at a bottom thereof to a plating solution supply pipe 308 (see FIG. 18), and is provided in a peripheral wall thereof with a plating solution recovery groove 260. In the plating tank 200, there are disposed two current plates 262, 264 for stabilizing flow of a plating solution flowing upward. A thermometer 266 for measuring a temperature of plating solution introduced into the plating tank 200 is disposed at the bottom of the plating tank 200. Further, on an outer surface of a peripheral wall of the plating tank 200 and at a position slightly higher than a liquid level of the plating solution held in the plating tank 200, there is provided a jet nozzle 268 for jetting a stop liquid which is a neutral liquid having a pH of 6 to 7.5, for example, pure water, inwardly and slightly upwardly in a normal direction. After plating, the substrate W held in the head portion 232 is raised and stopped at a position slightly above a surface of the plating solution. In this state, pure water (stop liquid) is immediately jetted from the jet nozzle 268 toward the substrate W to cool the substrate W, thereby preventing progress of plating by the plating solution remaining on the substrate W.

Further, at a top opening of the plating tank 200, there is provided a plating tank cover 270 which closes the top opening of the plating tank 200 during a non-plating time, such as idling time, so as to prevent unnecessary evaporation of plating solution from the plating tank 200.

Figure 18:
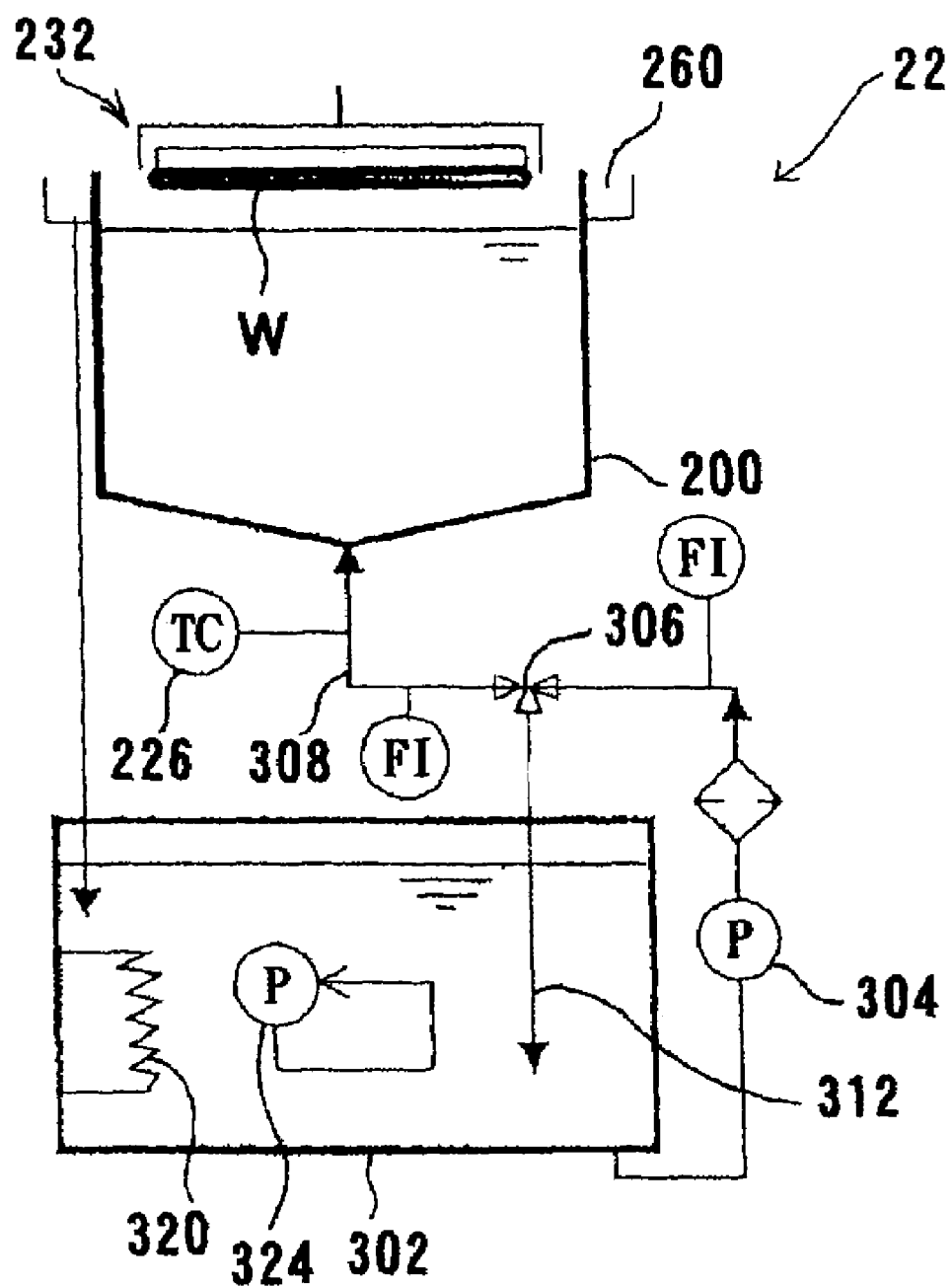
FIG. 18 is a diagram illustrating a system of the electroless plating unit.

As shown in FIG. 18, a plating solution supply pipe 308, extending from a plating solution storage tank 302 and having a plating solution supply pump 304 and a three-way valve 306, is connected to the plating tank 200 at the bottom of the plating tank 200. With this arrangement, during a plating process, a plating solution is supplied into the plating tank 200 from the bottom of the plating tank 200, and overflowing plating solution is recovered by the plating solution storage tank 302 through a plating solution recovery groove 260. Thus, the plating solution can be circulated. A plating solution return pipe 312 for returning the plating solution to the plating solution storage tank 302 is connected to one of ports of the three-way valve 306. Thus, the plating solution can be circulated even in a standby condition of plating, and a plating solution circulating system is constructed. As described above, the plating solution in the plating solution storage tank 302 is always circulated through the plating solution circulating system, and hence a lowering rate of concentration of the plating solution can be reduced and a number of substrates W which can be processed can be increased, compared with a case in which the plating solution is simply stored.

Particularly, in this embodiment, by controlling the plating solution supply pump 304, a flow rate of the plating solution which is circulated at a standby of plating or at a plating process can be set individually. Specifically, an amount of circulating plating solution at the standby of plating is in the range of 2 to 20 liter/minute, for example, and an amount of circulating plating solution during a plating process is in the range of 0 to 10 liter/minute, for example. With this arrangement, a large amount of circulating plating solution during standby of plating can be ensured to keep a temperature of a plating bath in the cell constant, and the flow rate of the circulating plating solution is made smaller during the plating process to form a coating film (plated film) having a more uniform thickness.

The thermometer 266 provided in the vicinity of the bottom of the plating tank 200 measures a temperature of the plating solution introduced into the plating tank 200, and controls a heater 316 and a flow meter 318 described below.

Specifically, in this embodiment, there are provided a heating device 322 for heating the plating solution indirectly by a heat exchanger 320 which is provided in the plating solution in the plating solution storage tank 302 and uses water as a heating medium which has been heated by a separate heater 316 and has passed through the flow meter 318, and a stirring pump 324 for mixing the plating solution by circulating the plating solution in the plating solution storage tank 302. This is because during electroless plating, in some cases, the plating solution is used at a high temperature (about 80° C.), and this structure should cope with such cases. This method can prevent very delicate plating solution from being mixed with foreign matter or the like, unlike an in-line heating method.

Figure 17:
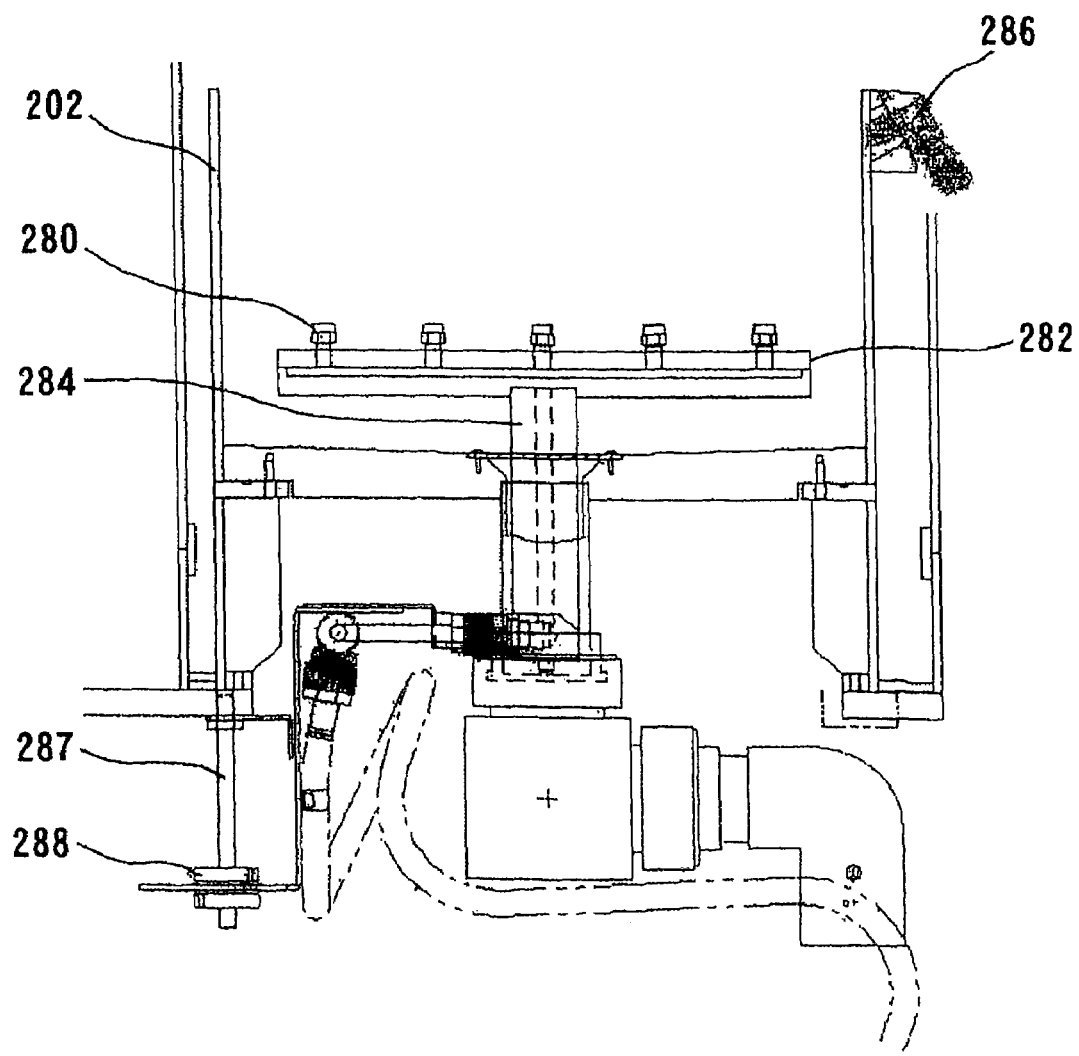
FIG. 17 is a cross-sectional view of a cleaning tank of the electroless plating unit.

FIG. 17 shows details of a cleaning tank 202 provided beside the plating tank 200. At a bottom of the cleaning tank 202, there is provided a nozzle plate 282 having a plurality of jet nozzles 280, attached thereto, for upwardly jetting a rinsing liquid such as pure water. The nozzle plate 282 is coupled to an upper end of a nozzle lifting shaft 284. The nozzle lifting shaft 284 can be moved vertically by changing a position of engagement between a nozzle position adjustment screw 287 and a nut 288 engaging the screw 287 so as to optimize a distance between the jet nozzles 280 and a substrate W disposed above the jet nozzles 280.

Further, on an outer surface of a peripheral wall of the cleaning tank 202 and at a position above the jet nozzles 280, there is provided a head cleaning nozzle 286 for jetting a cleaning liquid, such as pure water, inwardly and slightly downwardly onto at least a portion, which was in contact with the plating solution, of the head portion 232 of the substrate head 204.

In operating the cleaning tank 202, the substrate W held in the head portion 232 of the substrate head 204 is located at a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204, thereby preventing a deposit from accumulating on that portion which was immersed in the plating solution.

According to this electroless plating apparatus 22, when the substrate head 204 is in a raised position, the substrate W is held by vacuum attraction in the head portion 232 of the substrate head 204 as described above, while the plating solution in the plating tank 200 is allowed to circulate.

When plating is performed, the plating tank cover 270 is opened, and the substrate head 204 is lowered, while the substrate head 204 is rotating, so that the substrate W held in the head portion 232 is immersed in the plating solution in the plating tank 200.

After immersing the substrate W in the plating solution for a predetermined time, the substrate head 204 is raised to lift the substrate W from the plating solution in the plating tank 200 and, as needed, pure water (stop liquid) is immediately jetted from the jet nozzle 268 toward the substrate W to cool the substrate W, as described above. The substrate head 204 is further raised to lift the substrate W to a position above the plating tank 200, and rotation of the substrate head 204 is stopped.

Next, while the substrate W is held by vacuum attraction in the head portion 232 of the substrate head 204, the substrate head 204 is moved to a position right above the cleaning tank 202. While rotating the substrate head 204, the substrate head 204 is lowered to a predetermined position in the cleaning tank 202. A cleaning liquid (rinsing liquid), such as pure water, is jetted from the jet nozzles 280 to clean (rinse) the substrate W, and at the same time, a cleaning liquid such as pure water is jetted from the head cleaning nozzle 286 to clean at least a portion, which was in contact with the plating solution, of the head portion 232 of the substrate head 204.

After completion of cleaning of the substrate W, rotation of the substrate head 204 is stopped, and the substrate head 204 is raised to lift the substrate W to a position above the cleaning tank 202. Further, the substrate head 204 is moved to a transfer position between the transport robot 34 and the substrate head 204, and the substrate W is transferred to the transport robot 34, and is transported to a next process by the transport robot 34.

As shown in FIG. 18, the electroless plating apparatus 22 is provided with a plating solution management unit 330 for measuring an amount of plating solution held by the electroless plating apparatus 22 and for analyzing composition of the plating solution by an absorptiometric method, a titration method, an electrochemical measurement, or the like, thereby replenishing components which are insufficient in the plating solution. In the plating solution management unit 330, signals indicative of analysis results are processed to replenish insufficient components from a replenishment tank (not shown) to the plating solution storage tank 302 using a metering pump, thereby controlling an amount of the plating solution and composition of the plating solution. Thus, thin film plating can be realized with good reproducibility.

The plating solution management unit 330 has a dissolved oxygen densitometer 332 for measuring dissolved oxygen in the plating solution held by the electroless plating apparatus 22 by an electrochemical method, for example. According to the plating solution management unit 330, dissolved oxygen concentration in the plating solution can be controlled at a constant value on the basis of indication of the dissolved oxygen densitometer 332 by deaeration, nitrogen blowing, or other methods. In this manner, a dissolved oxygen concentration in the plating solution can be controlled at a constant value, and the plating reaction can be achieved with good reproducibility.

Figure 19:
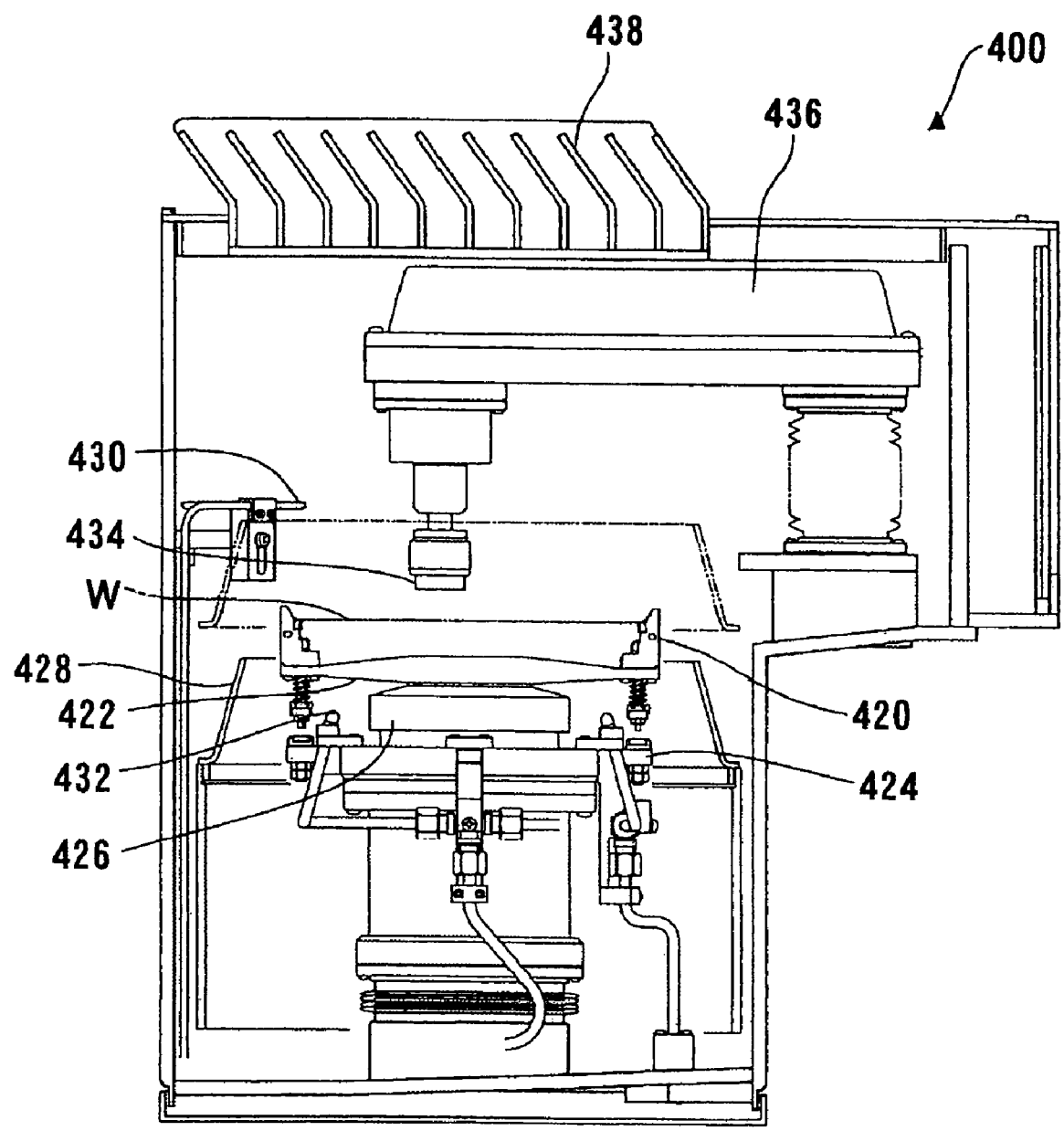
FIG. 19 is a vertical sectional front view of a post-treatment/drying unit.
Figure 20:
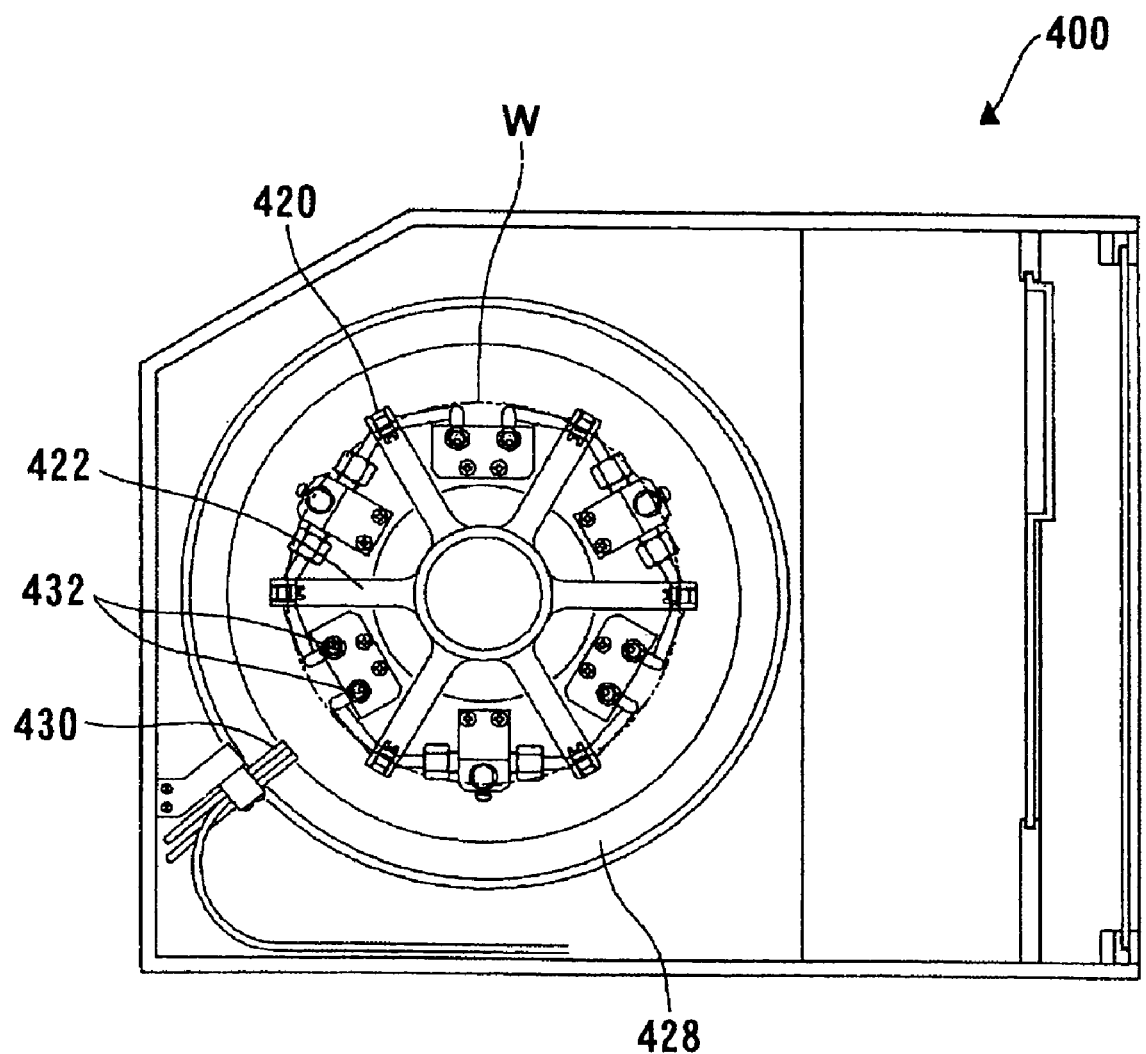
FIG. 20 is a plan view of a post-treatment/drying unit.

FIGS. 19 and 20 show a post-treatment/drying unit 400, which is used both as post-treatment unit 24 and the drying unit 26 shown in FIG. 3, for performing post-treating of a substrate and drying continuously. Specifically, the post-treatment/drying unit 400 performs chemical cleaning (post-treatment) and pure water cleaning (rinsing) first, and then complete drying of the substrate W which has been cleaned by spindle rotation. The post-treatment/drying unit 400 comprises a substrate stage 422 having a clamp mechanism 420 for clamping an edge portion of the substrate W, and a substrate mounting and removing lifting/lowering plate 424 for opening and closing the clamp mechanism 420.

The substrate stage 422 is coupled to an upper end of a spindle 426 that is rotated at a high speed by energization of a spindle rotating motor (not shown). Further, a cleaning cup 428 for preventing a treatment liquid from being scattered around is disposed around the substrate W held by the clamp mechanism 420, and the cleaning cup 428 is vertically moved by actuation of a cylinder (not shown).

Further, the post-treatment/drying unit 400 comprises a liquid chemical nozzle 430 for supplying a treatment liquid to the surface of the substrate W held by the clamp mechanism 420, a plurality of pure water nozzles 432 for supplying pure water to a backside surface of the substrate W, and a pencil-type cleaning sponge 434 which is disposed above the substrate W held by the clamp mechanism 420 and is rotatable. The pencil-type cleaning sponge 434 is attached to a free end of a swing arm 436 which is swingable in a horizontal direction. Clean air introduction ports 438 for introducing clean air into the apparatus are provided at an upper part of the post-treatment/drying unit 400.

With the post-treatment/drying unit 400 having the above structure, the substrate W is held and rotated by the clamp mechanism 420, and while the swing arm 436 is swung, a treatment liquid is supplied from the liquid chemical nozzle 430 to the cleaning sponge 434, and the surface of the substrate W is rubbed with the pencil-type cleaning sponge 434, thereby post-treating the surface of the substrate W. Further, pure water is supplied to the backside surface of the substrate W from the pure water nozzles 432, and the backside surface of the substrate W is simultaneously cleaned (rinsed) by pure water ejected from the pure water nozzles 432. Thus cleaned substrate W is spin-dried by rotating the spindle 426 at a high speed.

According to this embodiment, optical sensors that are orientable to any position on a substrate are used as the film thickness sensor 30$a$ and the film property sensor 30$b$ provided in the measurement unit 30. Each optical sensor may be one that utilizes spectroreflectometry, ellipsometry or spectroscopic ellipsometry using ultraviolet rays. With such an optical sensor, measurement can be performed in a non-destructive manner, i.e. without destroying a substrate, and in a short time of about several seconds to several tens of seconds for one measurement area. This is desirable in light of quality control. It is also possible to use an optical sensor which utilizes X-ray reflectance, grazing-incidence fluorescent X-rays or a plurality of laser interferometers. Such an optical sensor enables real-time measurement of a change in film properties of a film being processed (measurement object) in air or in a liquid.

When such an optical sensor is used as the film thickness sensor 30$a$ and the film property sensor 30$b$, a spot size of a sensor beam, after narrowing the beam, is generally from several $\mu$m to several tens of $\mu$m. On the other hand, when selectively covering exposed surfaces of interconnects 8 with a coating film (protective film) 9, as shown in FIG. 1, device performance is primarily governed by the coating film 9 formed on the interconnects 8. Accordingly, it is most important to control properties of the coating film 9 formed on the interconnects 8. However, width B of the interconnects 8 is generally not more than 1 $\mu$m (e.g. 0.16 $\mu$m). Accordingly, when attempting to directly measure a film thickness or properties of the coating film 9 formed on the interconnects 8 shown in FIG. 1, this measurement is influenced by an adjacent insulating film (insulating material) 2 whose surface is exposed. This will produce a large measurement error and, in some cases, make the measurement impossible.

According to this embodiment, as shown in FIGS. 21A and 21B, a measurement area P, which has a larger size than spot size S of a narrowed sensor beam of an optical sensor and on which a continuous film is to be formed, and a target area M as a control target are set (selected) within a region defining one clip C in a substrate W, such as a semiconductor wafer. A film thickness of the coating film 9 in the measurement area P is measured with the film thickness sensor 30$a$, which is an optical sensor, and a film property is measured with the film property sensor 30$b$, which is also an optical sensor, and, based on these measured values, the film thickness and the film property of the coating film 9 in the control target area M, which has a smaller size than the spot size S, are determined.

Figure 22:
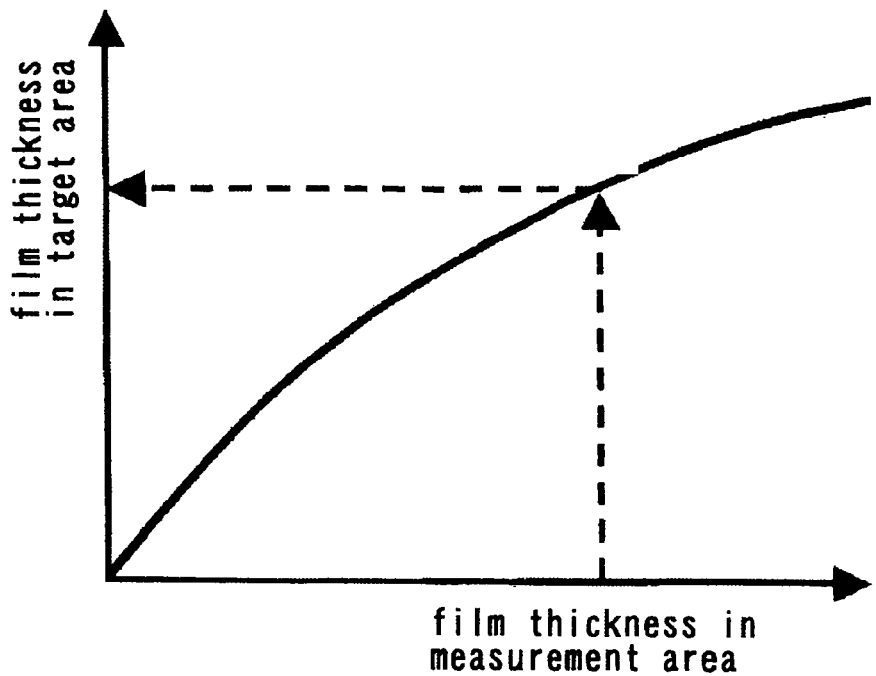
FIG. 22 is a calibration curve showing a relationship between a film thickness in a measurement area and a film thickness in a target area.

In particular, with respect to film thickness, film thicknesses of the coating film 9 in the measurement area P and in the target area M are measured, for example, by using a destructive measuring method such as TEM (transmission electron microscope), to thereby prepare a calibration curve showing a relationship between the film thickness of the coating film 9 in the measurement area P and that in the target area M, as shown in FIG. 22. A measured film thickness, which is measured in the measurement area P with the film thickness sensor 30$a$, is converted to the film thickness in target area M by using the calibration curve. The film thickness of the coating film 9 in the target area M can thus be determined in an indirect manner.

Also with film properties, as shown in 23, a calibration curve showing a relationship between a film property of the coating film 9 in the measurement area P and that in the target area M is prepared using, for example, a destructive method such as TEM. A measured film property, which is measured in measurement area P with the film property sensor 30b, is converted to the film property in target area M by using the calibration curve. The film property of the coating film 9 in target area M can thus be determined in an indirect manner. The film property to be measured is, for example, film composition, density, refractive index, surface roughness, reflectance, or interface width.

In this manner, a film thickness and film properties of a film formed on a substrate can be measured without being influenced by an insulating film (insulating material), and based on results of this measurement, a film thickness and film properties of a coating film formed on interconnects, whose measurement is generally impossible, can be determined indirectly via a calibration curve.

A film-forming region larger than the spot size S of the narrowed optical beam of an optical sensor can be utilized as a measurement area P on which film thickness and film properties are measurable, if such a region is present on a substrate. If there is no such region, it can be dealt with by making a dummy pattern in a desired region on a substrate.

Figure 4:
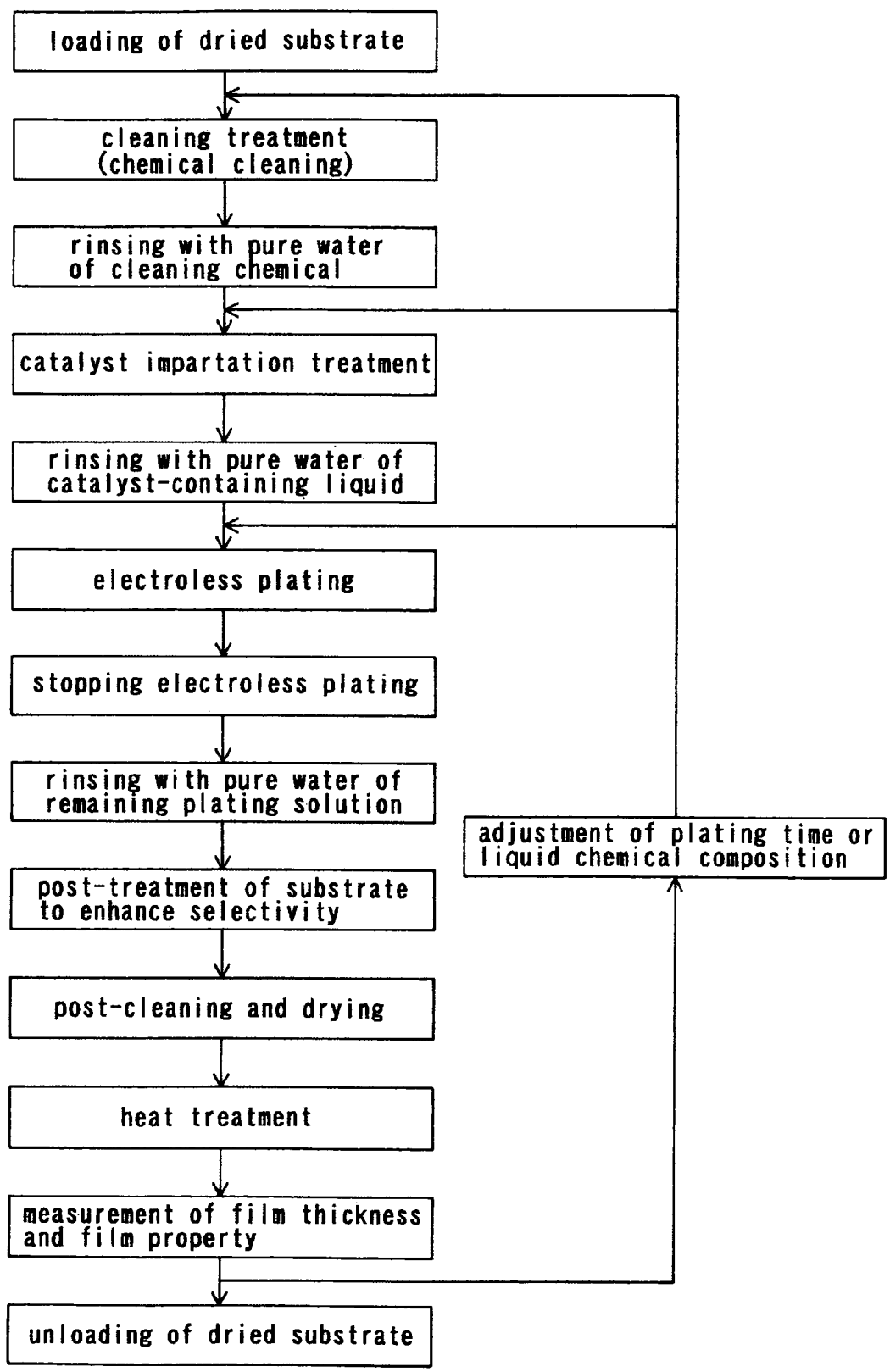
FIG. 4 is a flow chart of a plating process performed by the substrate processing apparatus shown in FIG. 3.

A description will now be given of a series of electroless plating processings, whose flow chart is shown in FIG. 4, performed by the substrate processing apparatus. The following description illustrates a case of selectively forming a coating film (protective film) 9 of a Co—W—P alloy to protect interconnects 8, as shown in FIG. 1.

First, one substrate W is taken by the transport robot 34 out of the cassette 10, set in the loading/unloading unit 12 and housing substrates W, with its front surface facing upwardly (face up), with each substrate W having been subjected to formation of interconnects 8 in surfaces followed by drying, and the substrate W is transported to the first pre-treatment unit 18. In the first pre-treatment unit 18, the substrate W is held face down, and cleaning treatment (chemical cleaning) as a pre-plating treatment is performed on a front surface. For example, a liquid chemical, such as dilute $H_2SO_4$, at a liquid temperature of e.g. 25° C. is jetted toward the surface of the substrate W to thereby remove CMP residues, such as copper, remaining on a surface of insulating film 2 (see FIG. 1), or an oxide on the interconnects. Thereafter, the cleaning chemical remaining on the surface of the substrate W is rinsed (cleaned) off with a rinsing liquid, such as pure water.

Liquid chemicals for use in this pre-treatment include an inorganic acid with a pH of not more than 2, such as hydrofluoric acid, sulfuric acid or hydrochloric acid; an acid with a pH of not more than 5 and having chelating ability, such as formic acid, acetic acid, oxalic acid, tartaric acid, citric acid, maleic acid or salicylic acid; and an acid with a pH of not more than 5 to which is added a chelating agent such as a halide, a carboxylic acid, a dicarboxylic acid, an oxycarboxylic acid, or a water-soluble salt thereof. By performing cleaning of the substrate with such a chemical, CMP residues, such as copper, remaining on the insulating film and an oxide on the surface of interconnects can be removed, whereby plating selectivity and adhesion of a plating to underlying material, i.e. the interconnects, can be enhanced. An anticorrosive agent, which is generally used in CMP, usually acts as an inhibitor against deposition of a plating film. Such an anticorrosive agent can be effectively removed by using an alkali chemical capable of removing an anticorrosive agent adhering to interconnects, for example, tetramethylammonium hydroxide (TMAH). The same effect as produced by the above-described acids can also be produced by an alkaline solution of an amino acid, such as glycine, cysteine, methionine, and the like.

Rinsing (cleaning) with a rinsing liquid of the surface of the substrate W after cleaning can prevent a chemical used in cleaning from remaining on the surface of the substrate W and impeding a next activation step. Ultrapure water is generally used as a rinsing liquid. Depending upon a material of the to-be-plated surface, however, an interconnect material can corrode, for example, due to local cell effect even when ultrapure water is used. It is desirable, in such a case, to use as a rinsing liquid water containing no impurity and having high reducing powder, such as hydrogen gas-dissolved water obtained by dissolving hydrogen gas in ultrapure water, or electrolytic cathode water obtained by subjecting ultrapure water to diaphragm-type electrolysis. In order to prevent possible corrosion of interconnect material, and the like, by the chemical used in cleaning, a time between cleaning and rinsing is preferably as short as possible.

Next, the substrate W after cleaning and rinsing is transported by the transport robot 34 to the second pre-treatment unit 20, where the surface of the substrate W is subjected to a catalyst impartation treatment while it is held face down. For example, a mixed solution of $PdCl_2/HCl$ at a liquid temperature of 25° C. is jetted toward the surface of the substrate W to thereby attach Pd as a catalyst to the surface of interconnects 8, i.e., form Pd nuclei as catalyst nuclei in surfaces of interconnects 8, thereby activating exposed surfaces of interconnects 8. Thereafter, the catalyst-containing liquid chemical remaining on the surface of the substrate W is rinsed (cleaned) off with a rinsing liquid, such as pure water.

An inorganic or organic solution containing Pd is used as the liquid chemical (catalyst-containing liquid). If the Pd content of the catalyst-containing liquid is too low, a catalyst density in the to-be-plated surface is so low that plating cannot be effected. Too high a Pd content will cause defects, such as formation of pits, in the interconnects 8.

In order to form a uniform and continuous electroless plating film over an entire surface of the substrate, a catalyst must be imparted to a to-be-plated surface at least in a certain amount. It has been confirmed experimentally that when using palladium as a catalyst, that certain amount (minimum amount) is 0.4 µg per 1 $cm^2$ of the to-be-plated surface. It is known that impartation of Pd in a high amount causes corrosion of the to-be-plated material and increases resistivity of this catalyst-imparted material. It has also been confirmed that this phenomenon is marked when palladium is imparted in an amount of 8 µg or more per 1 $cm^2$ of the to-be-plated surface. This impartation of the catalyst to the surface of the substrate W can enhance selectivity of electroless plating.

Further, in order to enhance the selectivity, it is necessary to remove Pd remaining on the insulating film 2 and on the interconnects 8. To this end, pure water rinsing is generally employed. As with the case of the cleaning treatment, the catalyst-containing liquid remaining on the substrate surface can exert adverse influence on the interconnects, such as corrosion, and on the plating step. It is therefore desirable that a time between the catalyst impartation treatment and rinsing be as short as possible. As with the case of the cleaning treatment, pure water, hydrogen gas-dissolved water or electrolytic cathode water may be used as a rinsing liquid. Alternatively, in order to make the substrate surface better adapted to an electroless plating solution which is used in a next plating step, it is also possible to use an aqueous solution of a component(s) composed of the electroless plating solution.

The substrate W after the catalyst impartation treatment and rinsing is transported by the transport robot 34 to the electroless plating unit 22, where electroless plating of the surface of the substrate W is performed while it is held face down. For example, the substrate W is immersed in a Co—W—P plating solution at a liquid temperature of 80° C., for example, for about 120 seconds to perform selective electroless plating (electroless Co—W—P cap plating) on activated surfaces of interconnects 8, thereby selectively forming a coating film (protective film) 9. The plating solution has, for example, the following composition:

$CoSO_4.7H_2O$: 14 g/L
$Na_3C_6H_5O_7.2H_2O$: 70 g/L
$H_3BO_3$: 40 g/L
$Na_2WO_4.2H_2O$: 12 g/L
$NaH_2PO_2.H_2O$: 21 g/L
pH: 9.5

A film formation rate of coating film 9 during electroless plating is preferably 10 to 200 Å per minute. Since a plating rate directly affects productivity, a low plating rate is generally undesirable. Too high a plating rate, however, cannot ensure uniformity and reproducibility of plating. The coating film 9 is often required to have a film thickness on the order of several tens of Å to several hundred Å. The plating rate (film formation rate) of 10 to 200 Å per minute is desirable to form the coating film 9 having such a film thickness. The plating rate can be controlled by both compositional conditions of the plating solution, such as pH, and reaction conditions, such as a reaction temperature.

The plating solution preferably contains W at a concentration of at least 1.5 g/L. In order for a plated Ni alloy or Co alloy to fully function as a coating film 9, this alloy film desirably contains an effective amount of W. In that case, the plating solution must contain W in a certain amount. By making the certain amount at least 1.5 g/L, the W content of the alloy can be controlled at an effective level.

As in this embodiment, the coating film 9 is preferably composed of an alloy comprising the three elements, Co, W and P. This is because among Ni alloys and Co alloys, an alloy comprising the three elements Co, W and P is relatively slow in its film formation rate, which is advantageous to formation of a thin film. In addition, the plating solution is relatively stable, thereby enabling easy control and reproduction of the film composition.

After raising the substrate W from the plating solution, a stop liquid, which is a neutral liquid having a pH of 6 to 7.5, is brought into contact with the surface of the substrate W, thereby stopping electroless plating. By thus stopping a plating reaction promptly after raising the substrate W from the plating solution, a plated film can be prevented from becoming uneven. A time for the treatment with the stop liquid is preferably from 1 to 5 seconds. The stop liquid may be exemplified by pure water, hydrogen gas-dissolved water and electrolytic cathode water. As described above, the interconnect material can corrode due to local cell effect. Such a problem can be avoided by stopping plating with ultrapure water which is made reductive.

Thereafter, the plating solution remaining on the surface of the substrate is rinsed (cleaned) off with a rinsing liquid, such as pure water. The coating film (protective film) 9 of Co—W—P alloy is thus formed selectively on the surfaces of interconnects 8 to protect the interconnects 8.

Next, the substrate W is transported by the transport robot 34 to the post-treatment unit 24, where the substrate is subjected to post-treatment to enhance selectivity of the coating film (plating film) 9 formed on the surfaces of the substrate W, thereby enhancing yield. In particular, while applying a physical force to the surface of the substrate W, for example, by performing roll scrub cleaning or pencil cleaning, a liquid chemical containing one or more of a surfactant, an organic alkali and a chelating agent is supplied to the surface of the substrate W to thereby completely remove plating residues, such as fine metal particles, on the insulating film 2, thus enhancing selectivity of plating. Use of such a liquid chemical can more effectively enhance selectivity of electroless plating. The surfactant is preferably a nonionic one, the organic alkali is preferably a quaternary ammonium compound or an amine, and the chelating agent is preferably ethylenediamine or its derivative.

When such a liquid chemical is employed, the chemical remaining on the surface of the substrate W is rinsed (cleaned) off with a rinsing liquid, such as pure water. The rinsing liquid may be exemplified by pure water, hydrogen gas-dissolved water and electrolytic cathode water. As described above, the interconnect material can corrode due to a local cell effect. Such a problem can be avoided by performing rinsing of the substrate with ultrapure water which is made reductive.

Besides the above-described roll scrub cleaning or pencil cleaning which effects cleaning through a physical force, it is also possible to employ cleaning with a complexing agent, uniform etching back with an etching liquid, and the like, or a combination thereof to completely remove plating residues remaining on the insulating film.

The substrate W after this post-treatment is transported by the transport robot 34 to the drying unit 26, where the substrate W is rinsed, according to necessity, and is then spin-dried by rotating it at a high speed.

The substrate W after spin-drying is transported by the transport robot 34 to the heat treatment unit 28, where the substrate W after the post-treatment is subjected to heat treatment (annealing) for modification of the coating film 9. Taking account of a practical processing time, a temperature necessary for modification of the coating film 9 is at least 120° C. Also taking account of heat resistance of materials constituting devices, a heating temperature is desirably not higher than 450° C. Accordingly, a temperature for heat treatment (annealing) is, for example, 120 to 450° C. By thus heat treating the substrate W, barrier properties of a coating film (plated film) formed on exposed surfaces of interconnects, and its adhesion to the interconnects, can be improved.

Figure 23:
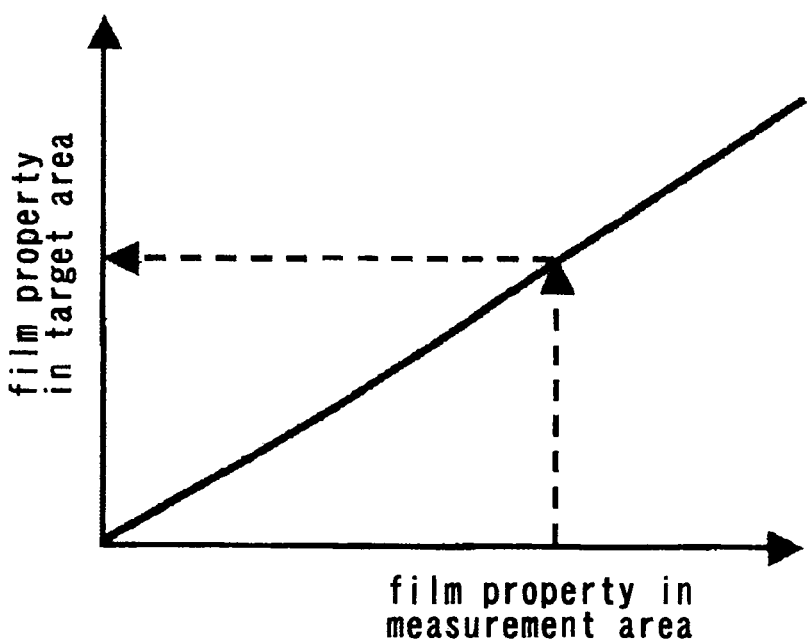
FIG. 23 is a calibration curve showing a relationship between a film property in a measurement area and a film property in a target area.

Next, the substrate W after the electroless plating and the heat treatment is transported by the transport robot 34 to the measurement unit 30. A film thickness and a film property (ies) of the coating film 9 in a measurement area P of the substrate W are measured by the film thickness sensor 30*a* and the film property sensor 30*b* provided in the measurement unit 30, respectively. These measured values are converted to the film thickness and the film property of the coating film 9 in a target area M by using calibration curves as shown in FIGS. 22 and 23, thus indirectly determining the film thickness and the film property in the target area M.

Results of an off-line measurement of the film thickness and film property of the coating film 9 formed on the exposed surfaces of interconnects 8 are fed back prior to electroless plating of a next substrate. Thus, based on the film thickness and the film property thus determined, a processing time for plating of the next substrate or a composition of a liquid chemical, for example, is adjusted. In this manner, the film thickness and film properties of the coating film 9 formed on the exposed surfaces of interconnects 8 can be controlled at constant values.

By thus measuring and controlling the film thickness and film properties of the coating film 9 after film formation, it becomes possible to ensure quality of the film and obtain a stable product even when the coating film is in the form a number of separate discontinuous films whose properties are likely to vary.

Next, the substrate W after this measurement is returned by the transport robot 34 to the substrate cassette 10 set in the loading/unloading unit 12.

Though in this embodiment a Co—W—P alloy film is used as the coating film 9, it is also possible to use a coating film composed of a Co—P, Ni—P, Ni—W—P, Co—B or Co—W—B alloy. Further, though copper is used as an interconnect material, it is also possible to use a copper alloy, silver, a silver alloy, gold, a gold alloy, or the like.

Though in this embodiment the film thickness and a film property(ies) of the coating film 9 (see FIG. 1) immediately after its formation in the electroless plating unit 22 are measured with the film thickness sensor 30a and the film property sensor 30b, both provided in the measurement unit 30, it is also possible to provide the film thickness sensor 30a and the film property sensor 30b on an inner surface of the plating tank 200 of the electroless plating unit 22, as shown in FIG. 16, and measure the film thickness and a film property of the coating film 9 in real time during film formation with the film thickness sensor 30a and the film property sensor 30b.

Further, though in this embodiment the measurement unit 30 is installed in the rectangular housing 16, the measurement unit 30 may be installed in a special space outside the housing 16.

It is, of course, possible to directly measure a film thickness and a film property at a desired position on a substrate. In this case, a particular area at the same position on each substrate may be set as a control target, and a film thickness and a film property in the particular area may be measured and controlled. This effectively prevents quality variations between substrates. It is also possible to set a plurality of areas on a substrate as control targets, and simultaneously or sequentially measure and control film thicknesses and film properties in this plurality of measurement areas. This can prevent quality variations in the substrate.

The present invention has been described above with reference to the case of measuring and controlling film thickness and/or film properties of the coating film 9 shown in FIG. 1 upon its formation in the electroless plating apparatus. Though not shown diagrammatically, the present invention is also applicable to a substrate processing apparatus including: an etching unit for etching a substrate having a metal and an insulating material exposed on its surface in such a manner that an exposed surface of the metal is selectively removed; a sensor for measuring a decrease in film thickness of a metal portion during and/or immediately after removal processing of the metal portion; and a control section for controlling the etching unit based on an output from the sensor. According to this apparatus, as shown in FIG. 2, when selectively etching and removing top portions of interconnects 8 by the etching unit to form recesses 8a preparatory to forming the coating film 9 such that its surface becomes flush with a surface of the insulating film 2, depth d of the recesses 8a is measured with the sensor. The control section controls the etching unit based on an output from the sensor so as to control the depth of the recesses 8a.

The present invention is also applicable to a substrate processing apparatus including: a polishing unit for polishing a substrate having a metal and an insulating material exposed on its surface in such a manner that an exposed surface of the metal is selectively removed; a sensor for measuring a decrease in film thickness of a metal portion during and/or immediately after removal processing of the metal portion; and a control section for controlling the polishing unit based on an output from the sensor. According to this apparatus, depth d of the recesses 8a shown in FIG. 2 can be controlled in the manner as in the preceding embodiment.

As described hereinabove, according to the present invention, a film thickness and/or film properties of a coating film are measured during and/or immediately after formation of the coating film, and a film thickness and/or film properties of a coating film is controlled. This ensures quality of this film and makes it possible to provide a stable product even when the film is in the form a number of separate discontinuous films whose properties are likely to vary. Further, by converting a measured film thickness or film property value of a processed film, measured in a measurement area, to a film thickness or film property of a processed film in a target area by using a prepared calibration curve, it becomes possible to indirectly determine the film thickness or film property of the processed film if the film is one that is formed on interconnects, whose measurement is generally impossible.

What is claimed is:

1. A method comprising:
on a substrate having a metal portion and an insulating material portion, with metal of said metal portion and insulating material of said insulating material portion exposed at a surface of said substrate, selectively forming a coating film on an exposed surface of said metal portion;
defining on said substrate a measurement area and a target area;
preparing beforehand a calibration curve showing a relationship between a film property of coating film in said measurement area and a film property of this coating film in said target area;
determining a film property of the selectively formed coating film in said measurement area during and/or immediately after selectively forming said coating film; and
converting the film property as determined to a film property of the selectively formed coating film in said target area by using said calibration curve.

2. The method according to claim 1, wherein
the film property of the coating film represented by said calibration curve, and the film property of the selectively formed coating film, comprise at least one of film composition, density, refractive index, surface roughness, reflectance and interface width.

3. The method according to claim 1, wherein
determining the film property of the selectively formed coating film in said measurement area comprises using an optical sensor, with said measurement area being sufficiently larger than a spot size of an optical beam emitted from said optical sensor.

4. The method according to claim 3, wherein
said optical sensor is an optical sensor that utilizes spectroreflectometry, ellipsometry or spectroscopic ellipsometry.

5. The method according to claim 3, wherein
said optical sensor is an optical sensor that utilizes X-ray reflectance, grazing-incidence fluorescent X-rays or a plurality of laser interferometers.

6. The method according to claim 3, wherein
defining on said substrate a measurement area comprises providing a dummy pattern on said substrate, with said dummy pattern serving as said measurement area.

7. The method according to claim 1, further comprising:
based on the film property resulting from converting the film property as determined, adjusting processing conditions for a next substrate to be processed.

8. A method comprising:

on a substrate having a metal portion and an insulating material portion, with metal of said metal portion and insulating material of said insulating material portion exposed at a surface of said substrate, selectively forming a coating film on an exposed surface of said metal portion;

defining on said substrate a measurement area and a target area;

preparing beforehand a calibration curve showing a relationship between a film thickness of coating film in said measurement area and a film thickness of this coating film in said target area;

measuring a film thickness of the selectively formed coating film in said measurement area during and/or immediately after selectively forming said coating film; and converting the film thickness as measured to a film thickness of the selectively formed coating film in said target area by using said calibration curve.

9. The method according to claim 8, wherein measuring the film thickness of the selectively formed coating film in said measurement area comprises using an optical sensor, with said measurement area being sufficiently larger than a spot size of an optical beam emitted from said optical sensor.

10. The method according to claim 9, wherein said optical sensor is an optical sensor that utilizes spectrorefletometry, ellipsometry or spectroscopic ellipsometry.

11. The method according to claim 9, wherein said optical sensor is an optical sensor that utilizes X-ray reflectance, grazing-incidence fluorescent X-rays or a plurality of laser interferometers.

12. The method according to claim 9, wherein defining on said substrate a measurement area comprises providing a dummy pattern, on said substrate, with said dummy patter serving as said measurement area.

13. The method according to claim 9, further comprising:

based on the film thickness resulting from converting the film thickness as measured, adjusting processing conditions for a next substrate to be processed.

* * * * *